United States Patent
Segarra

(10) Patent No.: US 7,489,186 B2
(45) Date of Patent: Feb. 10, 2009

(54) CURRENT SENSE AMPLIFIER FOR VOLTAGE CONVERTER

(75) Inventor: Daniel J. Segarra, Framingham, MA (US)

(73) Assignee: International Rectifier Corporation, El Segungo, CA (US)

( * ) Notice: Subject to any disclaimer, the term of this patent is extended or adjusted under 35 U.S.C. 154(b) by 84 days.

(21) Appl. No.: 11/622,263

(22) Filed: Jan. 11, 2007

(65) Prior Publication Data

US 2007/0188219 A1    Aug. 16, 2007

Related U.S. Application Data

(60) Provisional application No. 60/759,659, filed on Jan. 18, 2006.

(51) Int. Cl.
*H03F 3/45* (2006.01)

(52) U.S. Cl. ............... 330/2; 330/254; 330/256

(58) Field of Classification Search .......... 330/2, 330/254, 256; 363/65; 323/272
See application file for complete search history.

(56) References Cited

U.S. PATENT DOCUMENTS 6,894,464 B2 *   5/2005   Zhang .................. 323/268

2006/0001408 A1   1/2006   Southwell et al. .......... 323/282
2007/0064456 A1 * 3/2007   Schuellein .................. 363/65

FOREIGN PATENT DOCUMENTS

WO   WO 2005/031955   4/2005

* cited by examiner

*Primary Examiner*—Steven J Mottola
(74) *Attorney, Agent, or Firm*—Ostrolenk, Faber, Gerb & Soffen, LLP

(57) ABSTRACT

A current sense amplifier for a voltage converter wherein the voltage converter has at least one channel providing an output current through an output inductor, the current sense amplifier monitoring the current in the at least one channel through the output inductor, the current sense amplifier comprising a plurality of variable gain amplifiers, there being at least one more variable gain amplifier than channels in the voltage converter, whereby at least one variable gain amplifier is in a calibration mode for a preset period of time during which the variable gain amplifier is compensated for an offset error and the gain of the variable gain amplifier is calibrated to compensate for temperature of the output inductor, while during said preset period of time any remaining variable gain amplifiers are connected to monitor the channel current in each output inductor.

18 Claims, 31 Drawing Sheets

| FIG. 3A |
|---|
| FIG. 3B |

VGA GM CELL STATE TABLE

|  | STATE 1 | STATE 2 | STATE 3 | STATE 4 | STATE 5 | STATE 6 |
|---|---|---|---|---|---|---|
| CH1 | VGA1 gm_a | VGA3 gm_c | VGA3 gm_c | VGA2 gm_b | VGA2 gm_b | VGA1 gm_a |
| CH2 | VGA2 gm_b | VGA2 gm_b | VGA1 gm_a | VGA1 gm_a | VGA3 gm_c | VGA3 gm_c |
| CAL | VGA3 gm_c | VGA1 gm_a | VGA2 gm_b | VGA3 gm_c | VGA1 gm_a | VGA2 gm_b |

FIG.6

VGA1 OUTPUT MUX TABLE (GM CELL A)

INPUT CONNECTIONS

|  | STATE 1 | STATE 2 | STATE 3 | STATE 4 | STATE 5 | STATE 6 |
|---|---|---|---|---|---|---|
| CH1 | VGA1 gm_a | VGA3 gm_c | VGA3 gm_c | VGA2 gm_b | VGA2 gm_b | VGA1 gm_a |
| CH2 | VGA2 gm_b | VGA2 gm_b | VGA1 gm_a | VGA1 gm_a | VGA3 gm_c | VGA3 gm_c |
| CAL | VGA3 gm_c | VGA1 gm_a | VGA2 gm_b | VGA3 gm_c | VGA1 gm_a | VGA2 gm_b |

OUTPUT CONNECTIONS OF VGA1

| V6A1 gm cell OUTPUTS | OUTPUT MUX STATE 1 | OUTPUT MUX STATE 2 | OUTPUT MUX STATE 3 | OUTPUT MUX STATE 4 | OUTPUT MUX STATE 5 | OUTPUT MUX STATE 6 |
|---|---|---|---|---|---|---|
| IP1_A | TZA_P | GND | TZA_P | TZA_P | GND | TZA_P |
| IN1_A | TZA_N | GND | TZA_N | TZA_N | GND | TZA_N |
| IP2_A | RAMP_P | GND | RAMP_N | RAMP_N | GND | RAMP_N |
| IN2_A | RAMP_N | GND | RAMP_P | RAMP_P | GND | RAMP_P |
| IP3_A | IL1_P | CAL_P | IL2_P | IL2_P | CAL_P | IL1_P |
| IN3_A | IL1_N | CAL_N | IL2_N | IL2_N | CAL_N | IL1_N |

FIG.16

VGA2 OUTPUT MUX TABLE (GM CELL B)

| | STATE 1 | STATE 2 | STATE 3 | STATE 4 | STATE 5 | STATE 6 |
|---|---|---|---|---|---|---|
| CH1 | VGA1 gm_a | VGA3 gm_c | VGA3 gm_c | VGA2 gm_b | VGA2 gm_b | VGA1 gm_a |
| CH2 | VGA2 gm_b | VGA2 gm_b | VGA1 gm_a | VGA1 gm_a | VGA3 gm_c | VGA3 gm_c |
| CAL | VGA3 gm_c | VGA1 gm_a | VGA2 gm_b | VGA3 gm_c | VGA1 gm_a | VGA2 gm_b |

OUTPUT CONNECTIONS OF VGA2

| | STATE 1 | STATE 2 | STATE 3 | STATE 4 | STATE 5 | STATE 6 |
|---|---|---|---|---|---|---|
| IP1_B | TZA_P | TZA_P | GND | TZA_P | TZA_P | GND |
| IN1_B | TZA_N | TZA_N | GND | TZA_N | TZA_N | GND |
| IP2_B | RAMP_N | RAMP_N | GND | RAMP_P | RAMP_P | GND |
| IN2_B | RAMP_P | RAMP_P | GND | RAMP_N | RAMP_N | GND |
| IP3_B | IL2_P | IL2_P | CAL_P | IL1_P | IL1_P | CAL_P |
| IN3_B | IL2_N | IL2_N | CAL_N | IL1_N | IL1_N | CAL_N |

FIG.17

VGA3 OUTPUT MUX TABLE (GM CELL C)

| | STATE 1 | STATE 2 | STATE 3 | STATE 4 | STATE 5 | STATE 6 |
|---|---|---|---|---|---|---|
| CH1 | VGA1 gm_a | VGA3 gm_c | VGA3 gm_c | VGA2 gm_b | VGA2 gm_b | VGA1 gm_a |
| CH2 | VGA2 gm_b | VGA2 gm_b | VGA1 gm_a | VGA1 gm_a | VGA3 gm_c | VGA3 gm_c |
| CAL | VGA3 gm_c | VGA1 gm_a | VGA2 gm_b | VGA3 gm_c | VGA1 gm_a | VGA2 gm_b |

OUTPUT CONNECTIONS OF VGA3

| | STATE 1 | STATE 2 | STATE 3 | STATE 4 | STATE 5 | STATE 6 |
|---|---|---|---|---|---|---|
| IP1_C | GND | TZA_P | TZA_P | GND | TZA_P | TZA_P |
| IN1_C | GND | TZA_N | TZA_N | GND | TZA_N | TZA_N |
| IP2_C | GND | RAMP_P | RAMP_P | GND | RAMP_N | RAMP_N |
| IN2_C | GND | RAMP_N | RAMP_N | GND | RAMP_P | RAMP_P |
| IP3_C | CAL_P | IL1_P | IL1_P | CAL_P | IL2_P | IL2_P |
| IN3_C | CAL_N | IL1_N | IL1_N | CAL_N | IL2_N | IL2_N |

FIG.18

SNAPSHOT OF THERMAL GAIN CALIBRATION

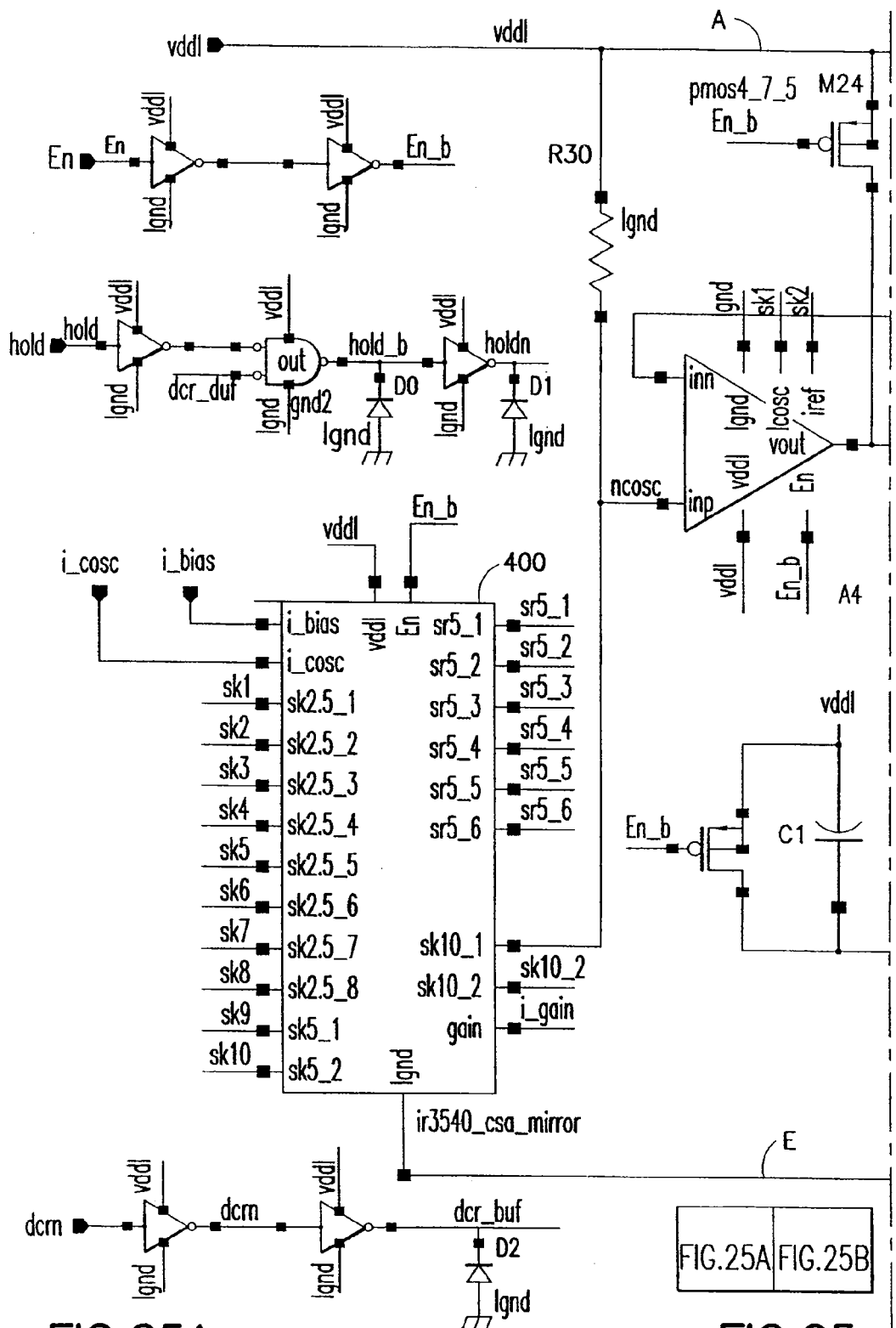
FIG.25A                    FIG.25

CURRENT SENSE AMPLIFIER FOR VOLTAGE CONVERTER

CROSS REFERENCE TO RELATED APPLICATION

The present application claims the benefit and priority of U.S. Provisional Application Ser. No. 60/759,659 filed Jan. 18, 2006 and entitled CURRENT SENSE AMPLIFIER FOR SENSING THE OUTPUT CURRENT OF A SWITCHING POWER SUPPLY, FOR EXAMPLE, OUTPUT INDUCTOR CURRENT OF A MULTI-PHASE BUCK CONVERTER, the entire disclosure of which is hereby incorporated by reference herein.

BACKGROUND OF THE INVENTION

The present invention relates to a current sense amplifier for sensing the current in the output stage or stages providing the phase or channel currents in a voltage converter, e.g., a multi-phase converter or power supply.

In a multi-phase converter, a number of switching power supplies, for example buck converter stages, are controlled by a power supply controller and driver stage. Each of the phase stages is coupled across a DC voltage bus and provides a portion of the output current, typically in a time phase sequence.

FIG. 1 shows a block diagram of a multi-phase converter to which the invention is applicable. FIG. 1 shows a two-phase converter, but the invention is applicable to converters having more phases.

A controller 10 provides control signals, typically pulse width modulated (PWM), to control the turn-on of the output stages 20 and 30. The first output stage 20 provides a first output phase to the output of the converter which is developed across an output capacitor C. Each converter output phase stage, here a buck converter, comprises two series connected switches, for example MOSFETS, connected in a bridge across the DC bus VIN. Each stage comprises a high side and a low side transistor which are switched complementarily with a dead time between the on times of the two switches. Typically, each stage 20 and 30 supplies output current to the output VOUT at a different time so that the currents in the inductors L1 and L2 supplied by the high side switches flow to the output at different times. In this way, each output stage contributes to the total current provided at VOUT. Multiphase converters are typically employed in personal computers, laptops and servers, for example, and can provide very high currents, typically at low voltages of less than 2 volts required by today's modern microprocessors. As is well known, the high side switch provides current to the inductor to charge the inductor and output capacitor and power the load. When the high side switch goes off, the low side switch is turned on and continues to source the inductor current to the load. Each output stage is operated in a timed sequence so that each high side output transistor provides output current to the load at a different time.

The controller 10 in FIG. 1 also shows the CPU microprocessor load 15 which is provided with power at the output VOUT. In addition, the microprocessor provides a digital VID signal which consists of a number of bits to inform the controller 10 of the output voltage required, which can vary depending upon the CPU's operating conditions, i.e., whether it is in a high power state or a low power state. Further, the controller 10 may have additional inputs from the CPU including a signal which controls the conduction state of the output inductors L1 and L2, e.g., to a continuous conduction state; whether the controller 10 is in single or two-channel (phase) operation. Further, a thermal monitoring signal may be supplied from controller 10 to the CPU and provides thermal monitoring output to enable the CPU to monitor the temperature of the power controller 10.

In addition, the controller 10 provides a CLOCK ENABLE signal which starts the CPU system clock and a signal to initialize the CPU after a delay. In addition, controller 10 receives a signal VR-ON which enables the controller 10 and may have a connection to a serial bus, for example an SM bus, for monitoring or control by another processor.

In multi-phase converter circuits, it is necessary to sense the output current of each phase in order to regulate the current flowing through each phase to provide adaptive voltage positioning, to equalize the currents and to monitor for overcurrent conditions. This must be done accurately and reliably.

SUMMARY OF THE INVENTION

The present invention is directed to a current sense amplifier for a multiphase converter for sensing the current in each phase or channel accurately and which maintains calibration to compensate for offset voltages in the current sense amplifier and thermal changes in each phase. The functions of the current sense amplifier are to sense current in each of the two channels or phases in order to provide desired load line behavior such that the control IC regulates to a lower voltage at higher load currents which is known as adaptive voltage positioning (AVP) or droop, to maintain overcurrent protection, and to maintain current balance between the channels.

The current sense amplifier of the present invention is designed to use DCR current sensing wherein the voltage across the DC inherent resistance of each output inductor is monitored to determine the output current. As known in the art, in DCR current sensing, a series RC filter is placed across the output inductor and an amplifier monitors the voltage across the capacitor of the RC filter to sense the inductor current without introducing an additional sensing resistor in series with the inductor which could cause power loss. Typically, MOS input devices are used in the amplifier to provide a high input impedance.

According to the invention, a variable gain amplifier is used to compensate for the variation of inductor resistance with temperature. Further, an active offset calibration is used in order to enable an accurate measurement of the small input signal provided across the capacitor of the RC circuit.

The present invention is designed to meet, for example, the Intel IMVP-VI mobile CPU power specification.

According to the invention, at least one more amplifier is provided than there are channels in the converter. In this way, at least one amplifier is always being calibrated, while the others are actively monitoring the channel currents. For example, for a two-phase or two channel converter, three variable gain amplifiers are provided. Two of the three amplifiers are provided to respectively monitor the current in an output channel. The third amplifier is calibrated during the time when the other two amplifiers sense the current in the respective output inductors. The variable gain amplifiers operate according to a state table such that they are rotated to sense the currents in the output stages in a time sequence. Accordingly, the variable gain amplifier that has been most recently calibrated replaces the variable gain amplifier that was the least recently calibrated. The variable gain amplifier is calibrated to compensate for both offset and temperature. The process then repeats, with the newly calibrated variable gain amplifier replacing the least recently calibrated amplifier and the newly calibrated amplifier and the remaining variable gain amplifier now sensing respective ones of the output currents while the replaced amplifier is being calibrated. The latter amplifier, after it is calibrated, then replaces the next variable gain amplifier that was least recently calibrated and the process continues. In this way, the current sense amplifier comprising three variable gain amplifiers for a two-channel multi-phase converter, is always kept in a state of calibration.

The invention also comprises a novel variable gain amplifier which is used to sense current in each output channel as well as a novel offset and thermal gain calibration circuit.

In accordance with the invention, a variable gain amplifier is provided comprising a differential input amplifier comprising a pair of transistors each having an input across which an input voltage is provided, the transistors being coupled such that each transistor is provided in series with a respective current source providing a reference current and whereby a current is developed across a resistor element coupling the transistors that is proportional to the voltage between the inputs; further comprising further transistors each coupled in series with a transistor of the transistor pair, and wherein the further transistors are arranged such that a current is developed in each further transistor due to the voltage provided across the inputs that is substantially equal to, in one further transistor, a sum of the reference current and the current in the resistor element, and in the other further transistor, a difference between the reference current and the current in the resistor element; further comprising a gain stage for developing currents equal to a gain factor multiplied by said sum and difference currents and for developing an output current proportional to said gain factor multiplied by said current through said resistor element; further comprising an interface for selectively providing a signal proportional to a variable across said inputs of said differential amplifier to drive said output current to an output current value; and a gain setting circuit responsive to said output current value that produces a gain setting signal to adjust the gain of said variable gain amplifier.

Also in accordance with the invention, a thermal calibration circuit for adjusting the gain of a variable gain amplifier is provided, the thermal calibration circuit comprising an interface for receiving a signal that varies with temperature and for providing a signal related to the variation of the temperature; a variable gain amplifier having an input and an output; the signal related to the variation of the temperature being selectively coupled to said input; a circuit at the output of said variable gain amplifier for developing a first current proportional to a difference between a current developed at the output of said variable gain amplifier and a reference current; said first circuit driving a further circuit to produce a gain control signal for adjusting the gain of the variable gain amplifier.

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which:

FIG. 6 shows a state table of the six states of the current sense amplifier according to the present invention for a two-channel converter;

FIG. 16 shows the output multiplexer table for the first variable gain amplifier;

FIG. 17 shows the output multiplexer table for the second variable gain amplifier;

FIG. 18 shows the output multiplexer table for the third variable gain amplifier;

Figures 23, 23B:
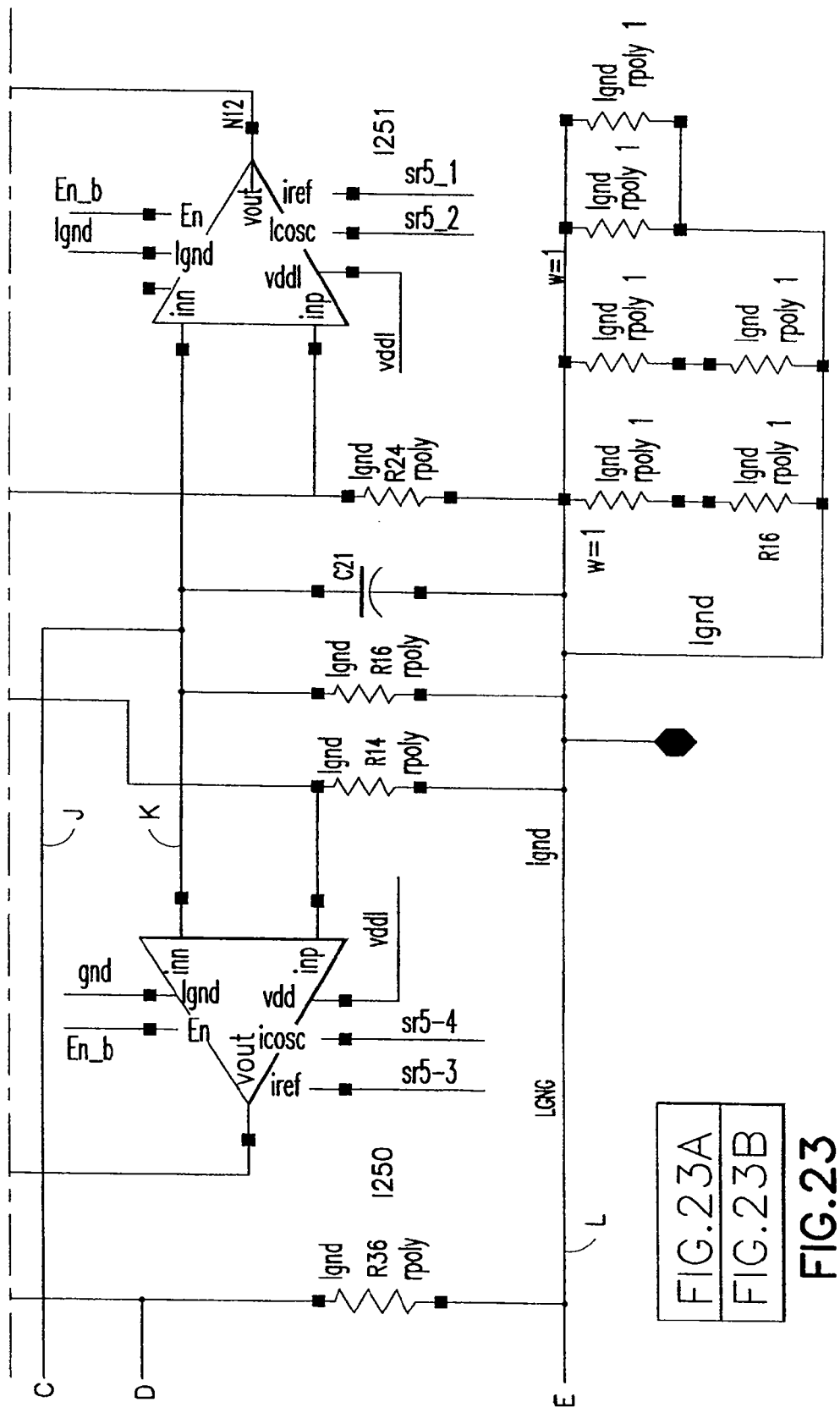
Figure 23A:
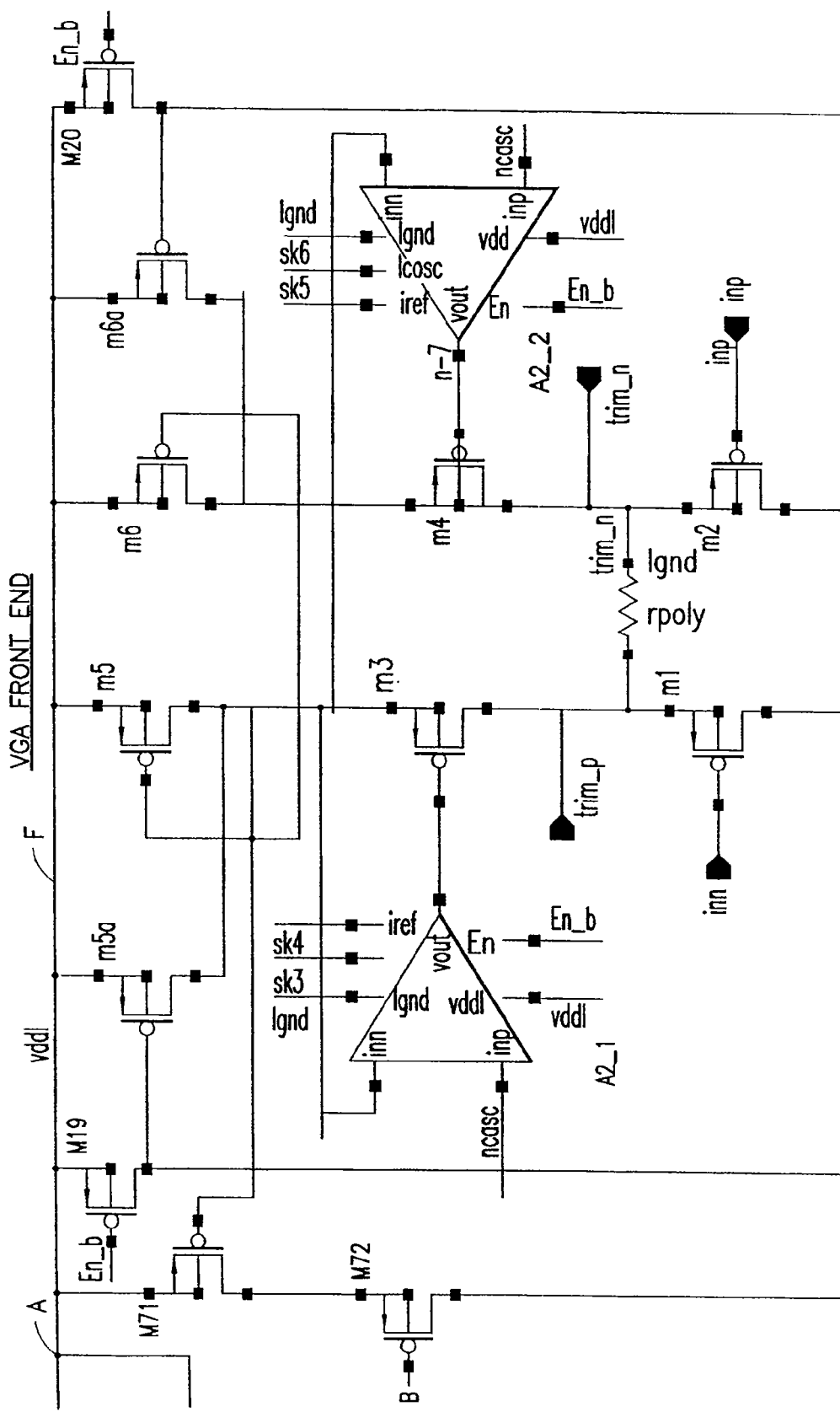
Figure 24:
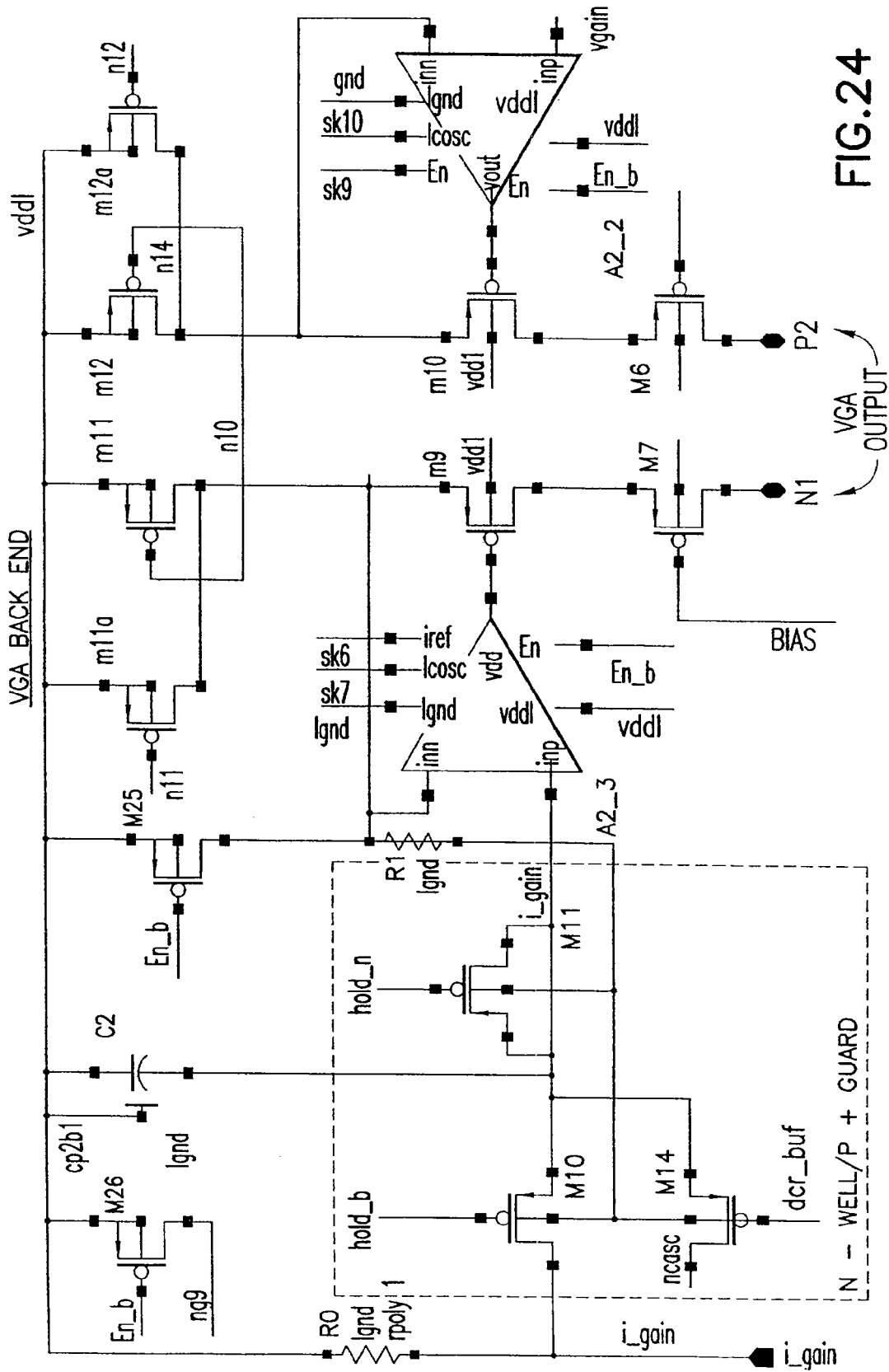
Figure 25B:
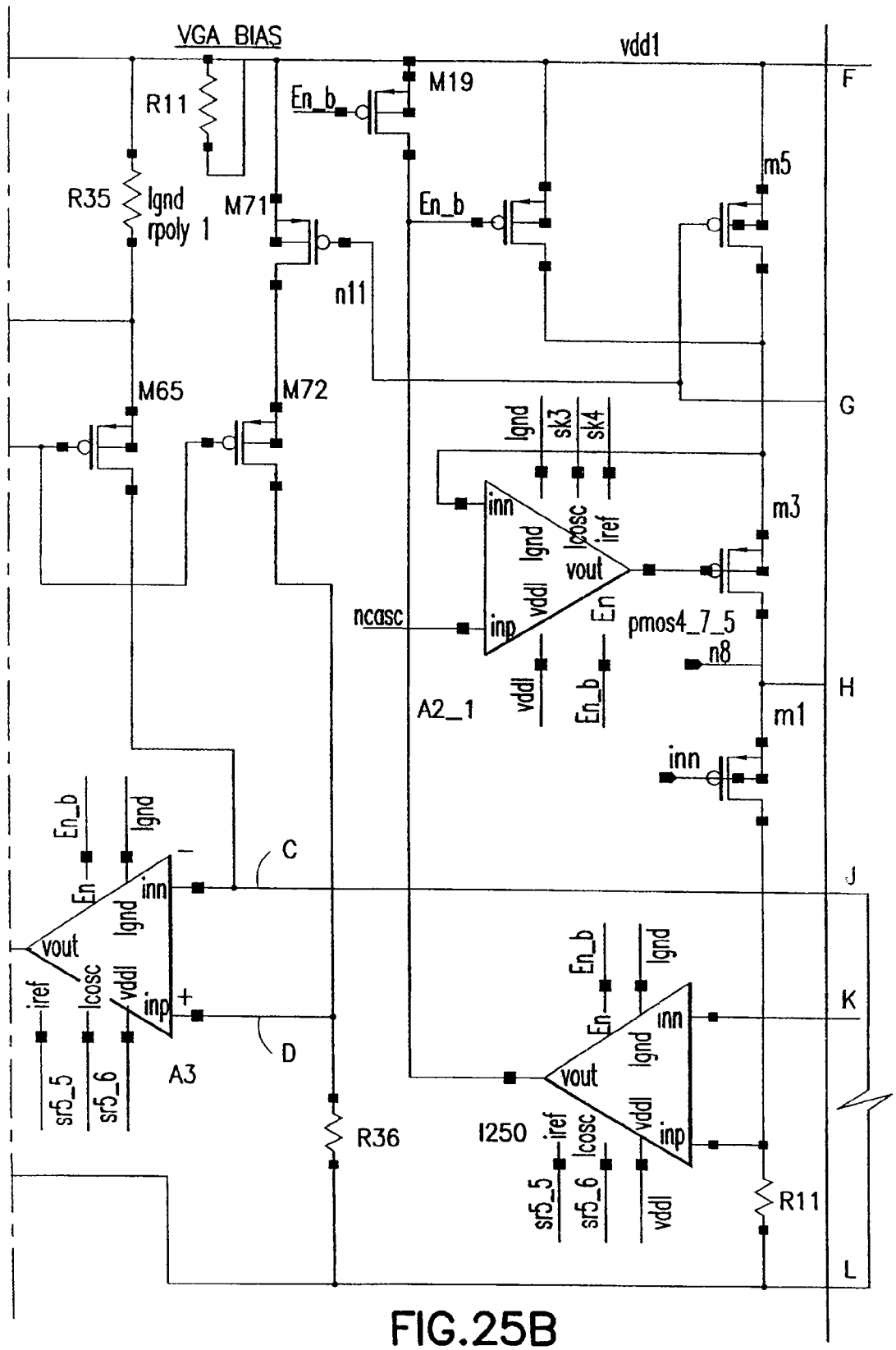
Figure 26:
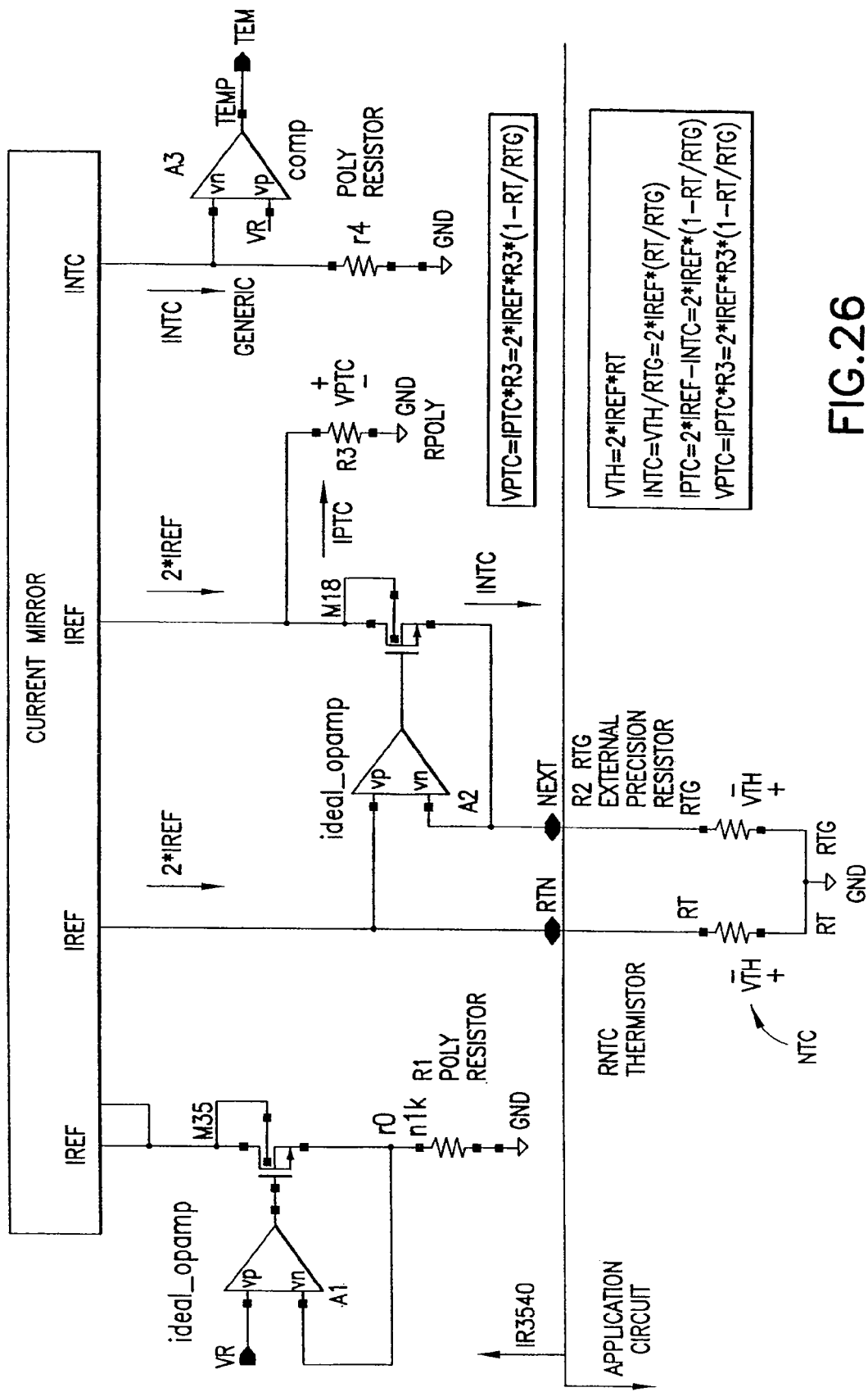
Figure 27:
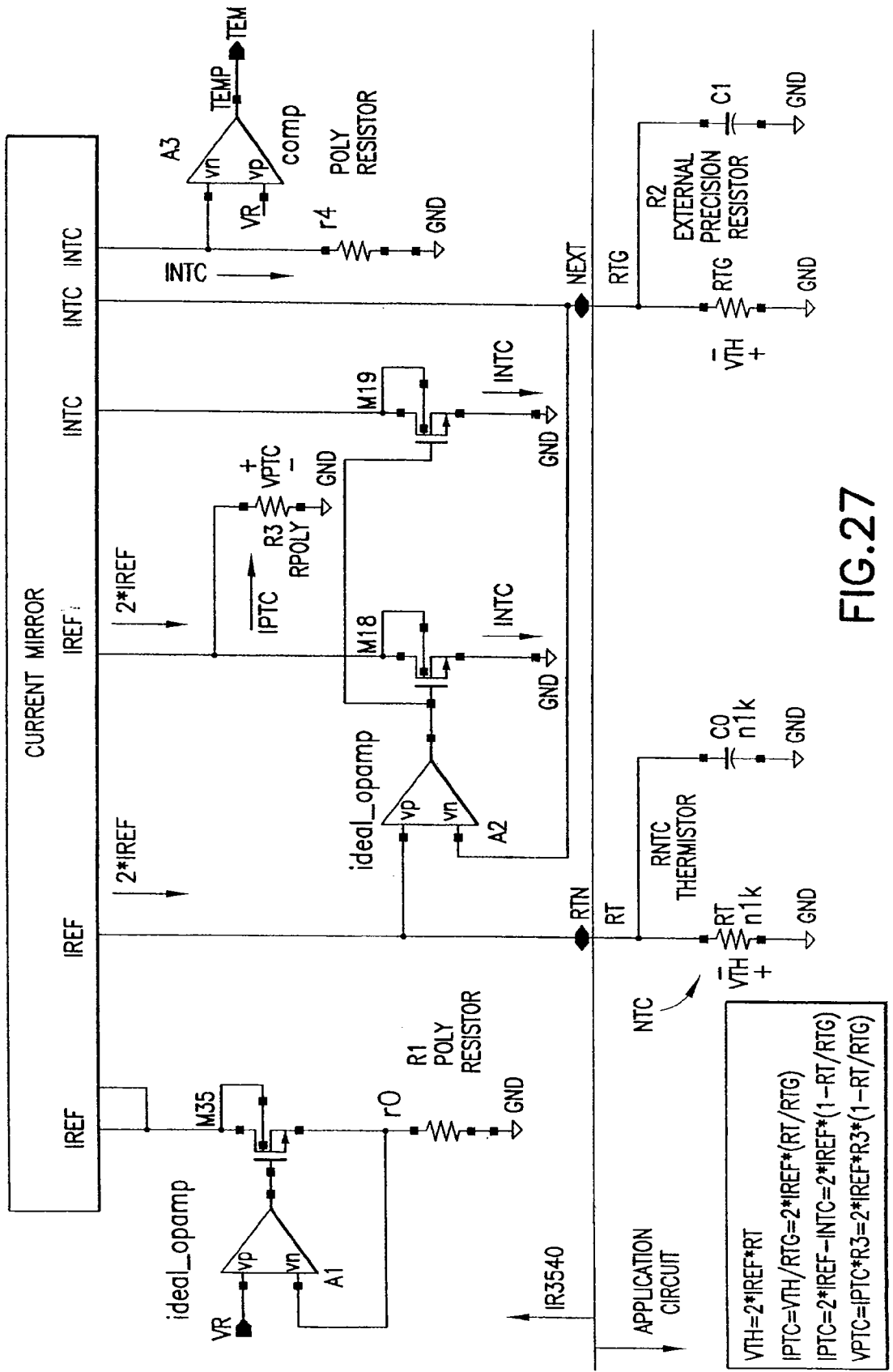
Figure 28:
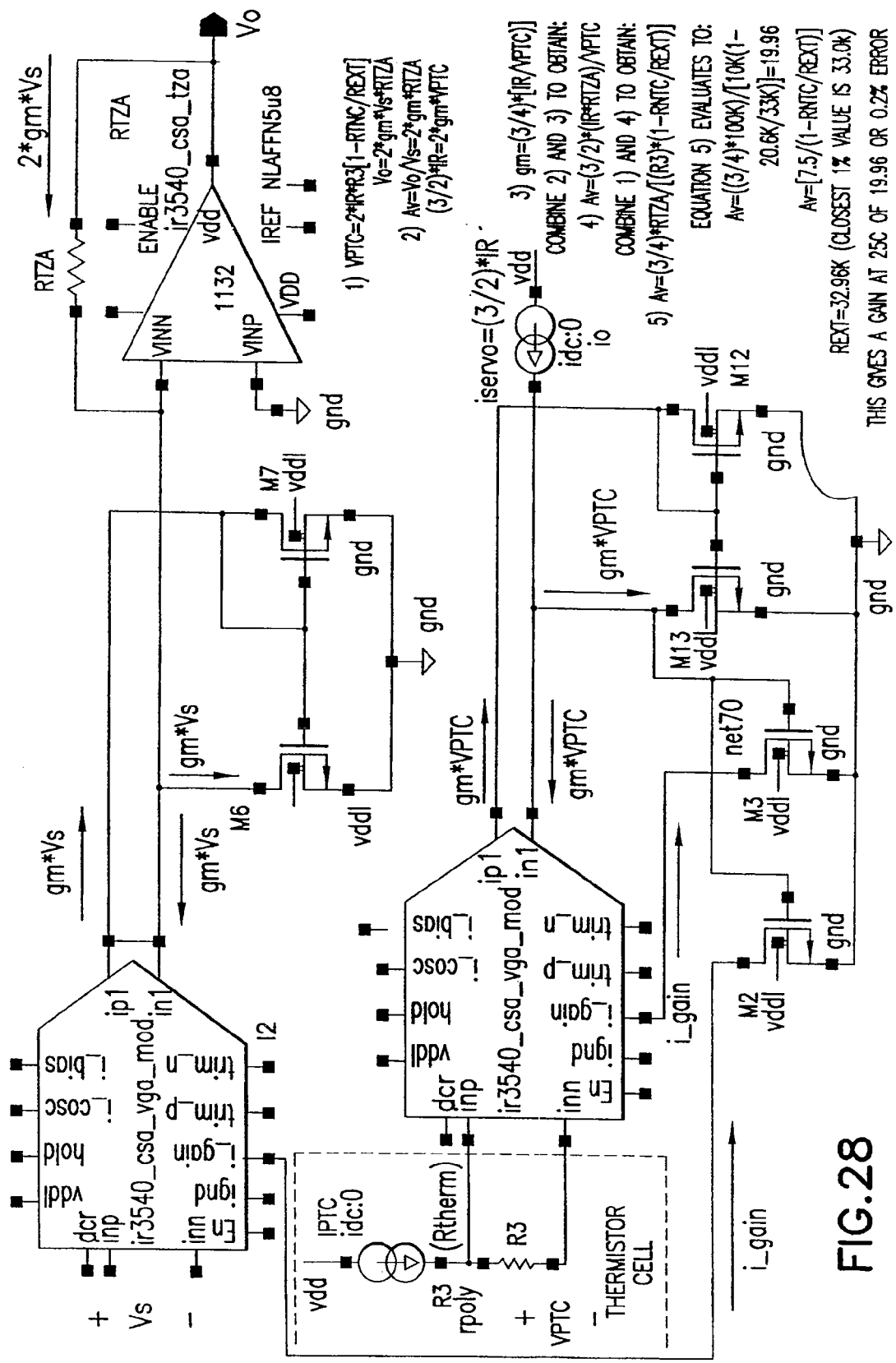

FIGS. 23, 24 and 25 taken together show the circuit diagram for a variable gain amplifier;

FIG. 26 shows a first circuit embodiment for a thermal interface used in thermal calibration including matching dependencies;

FIG. 27 shows a second circuit embodiment for a thermal interface used in thermal calibration; and FIG. 28 shows the total system gain calculations for the current sense amplifier.

DETAILED DESCRIPTION OF PREFERRED EMBODIMENTS OF THE INVENTION

Figure 1:
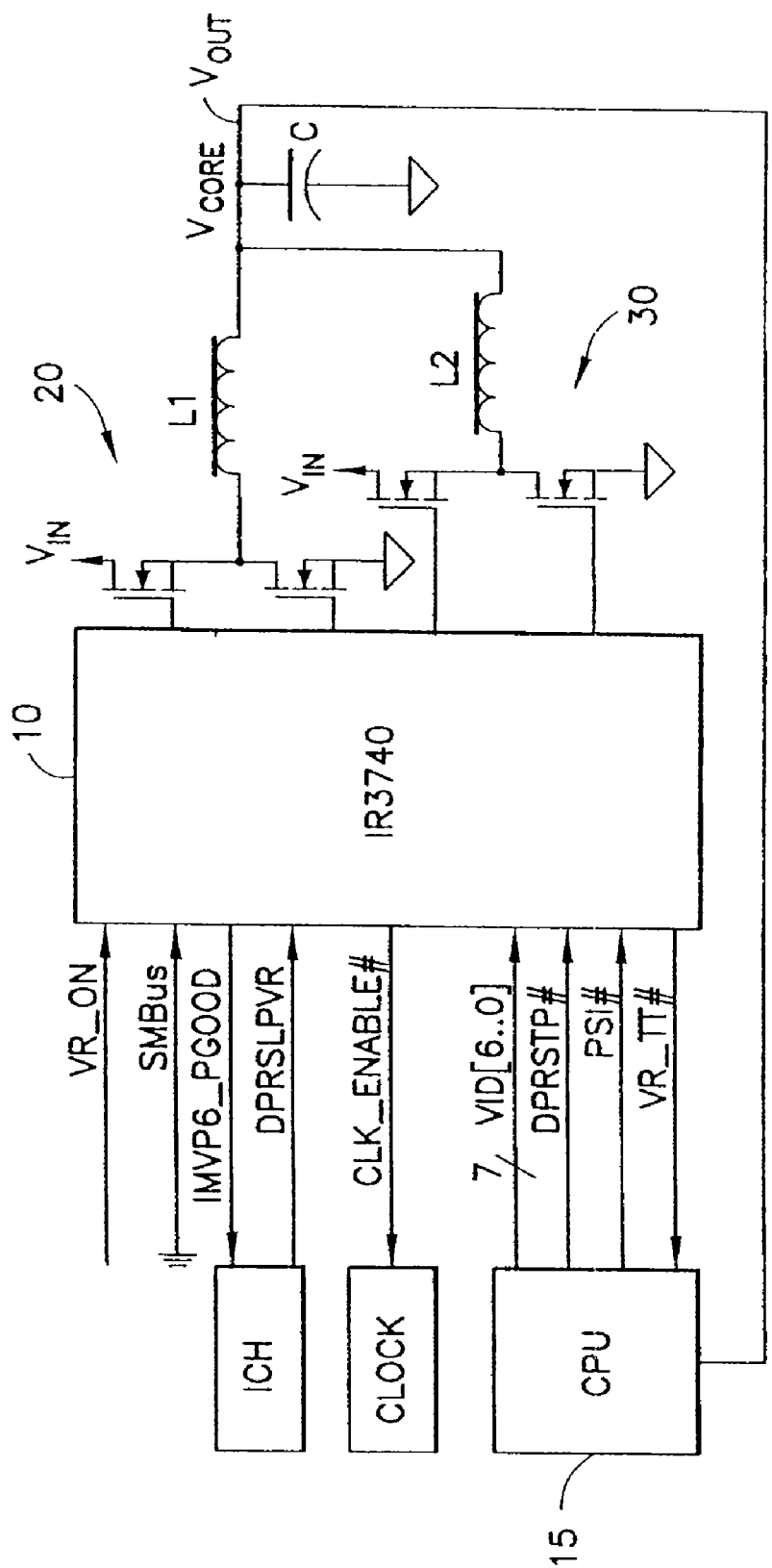
FIG. 1 shows a two-channel multi-phase converter.
Figure 2:
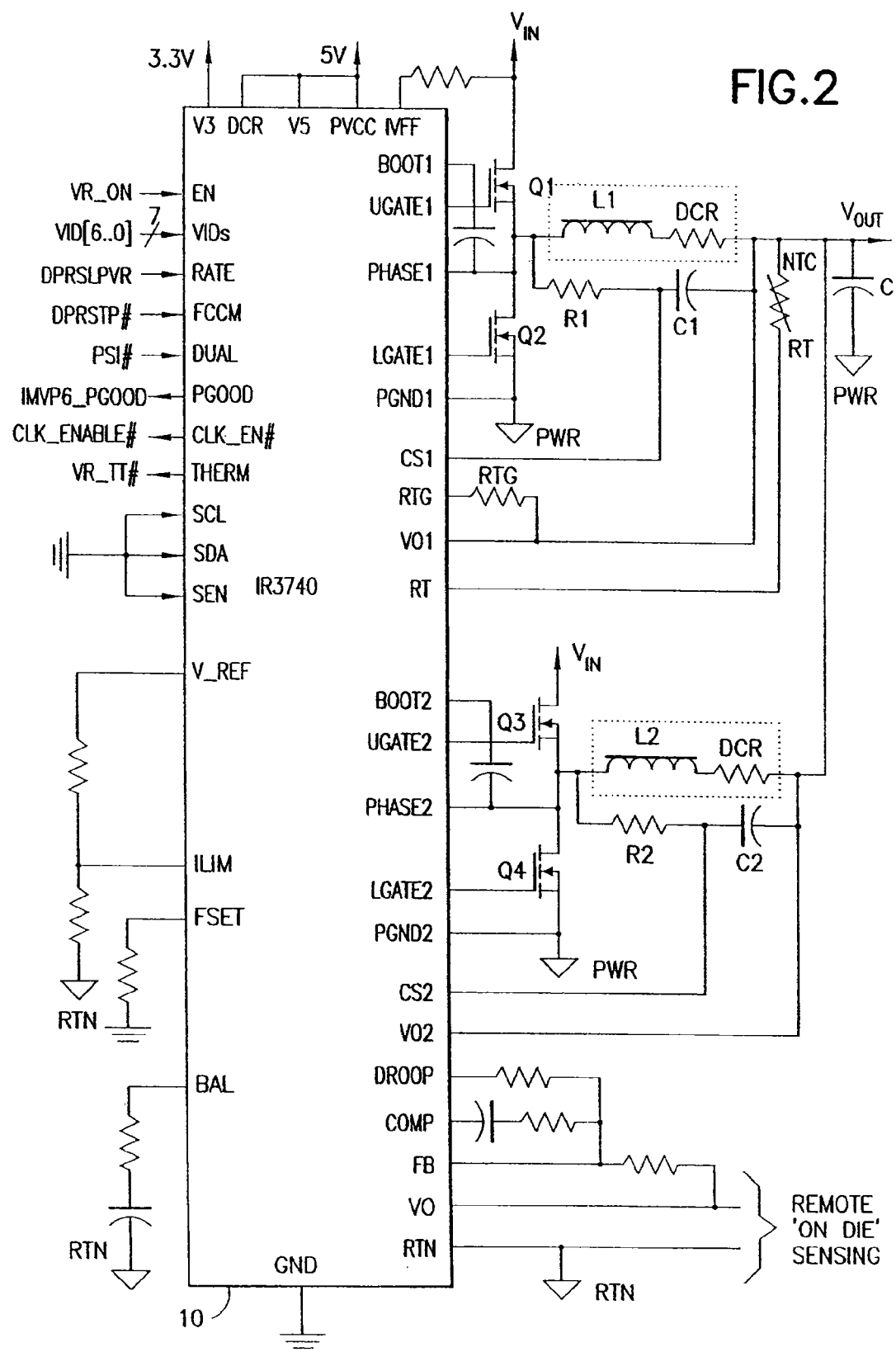
FIG. 2 shows further details of the two-channel multi-phase converter of FIG. 1 employing the current sense amplifier according to the present invention.

With reference now to the drawings, FIG. 2 shows a two-channel multi-phase converter like that of FIG. 1 to which the current sense amplifier of the present invention is applicable. Although a two channel converter is shown, the invention is applicable to converters with one channel or more than two channels. For example, in a single phase converter, two variable gain amplifiers can be used, with one of the two being in calibration at any point in time. For a three phase converter, four amplifiers (or more) could be used.

The controller 10 provides phased driving signals for turning on and off the transistors Q1 and Q2 of channel 1 and the transistor Q3 and Q4 of channel 2. The current provided by each channel to the output VOUT which supplies the load is monitored using the DCR technique as described above by placing an RC filter circuit comprising the circuit R1C1 for channel 1 and R2C2 for channel 2 across the respective inductances L1, L2 which are shown as ideal inductors L1, L2 and their corresponding inherent resistances or DCR. Since the DCR and the temperature of each inductor may vary, each channel has its own RC circuit which is connected to the current sense amplifier provided in the controller 10. Furthermore, a thermal device NTC, for example a thermistor, is connected between input RT and VOUT. In addition, a resistive element RTG, e.g., a precision resistor, is connected between the terminal RTG, as will be described in more detail below, and the output VOUT. For channel 1, the current is monitored across input CS1 and VO1. For channel 2, the current is monitored across input CS2 and VO2.

Figures 3, 3A:
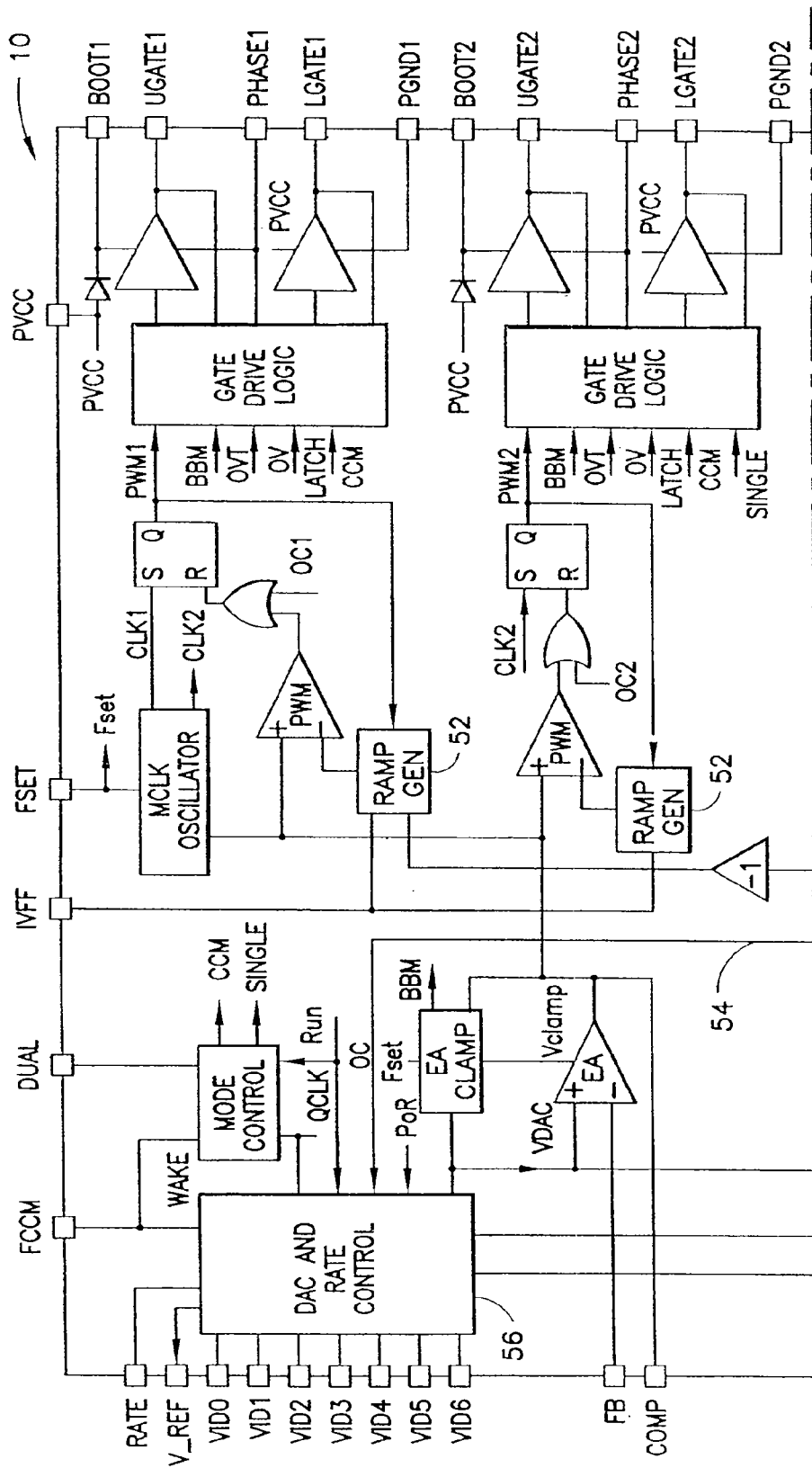
FIG. 3 shows a block diagram of the controller of FIG. 2.
Figure 3B:
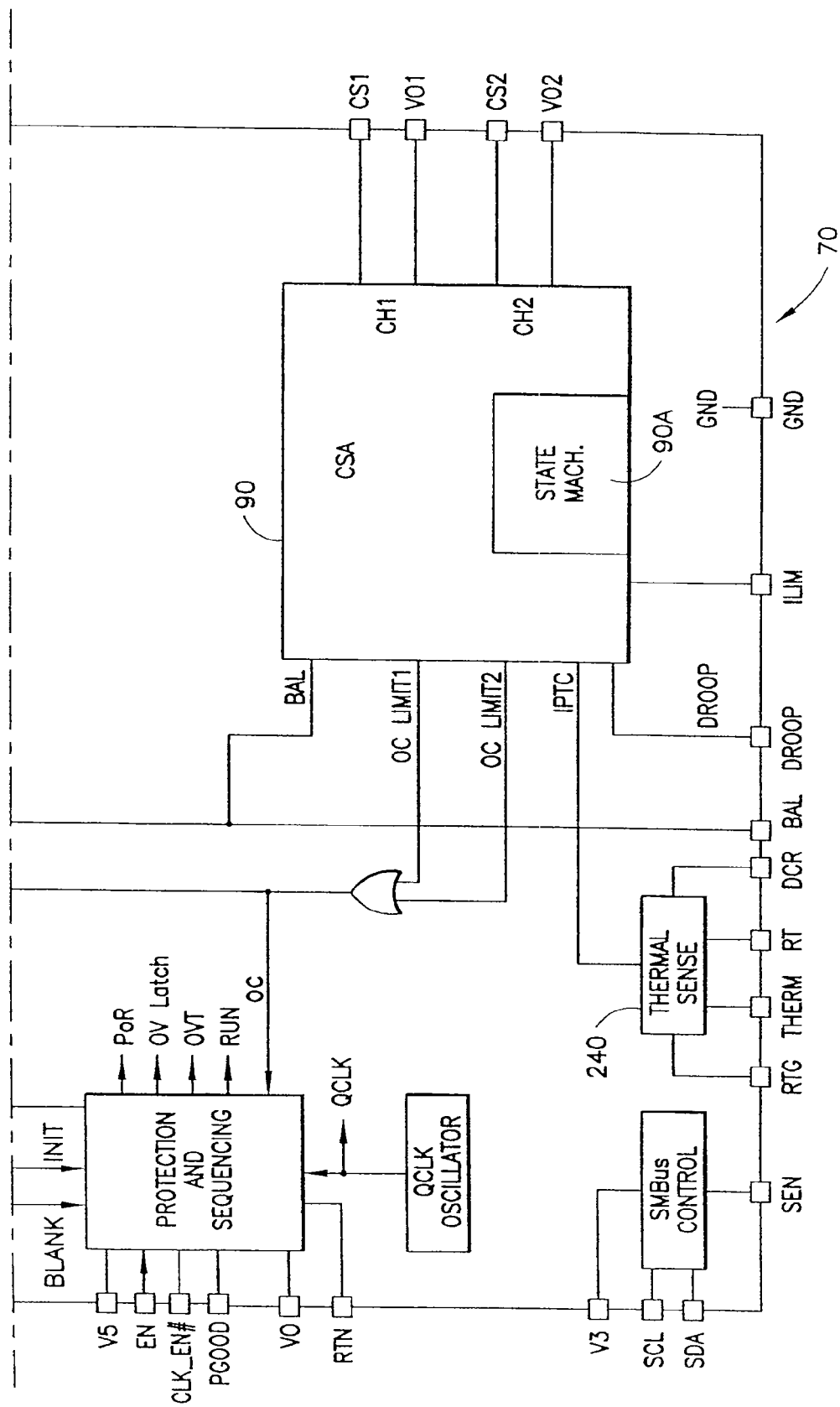

FIG. 3 shows a block diagram of the controller 10. The current sense amplifier (CSA) 90 is shown schematically and is controlled by a digital state machine 90A, the operation of which will be explained in detail below. The digital state machine 90A controls the rotation of three variable gain amplifiers, described in detail with reference to FIG. 4. At any one time, two of the variable gain amplifiers are monitoring the currents in the two channels while the third variable gain amplifier is being calibrated. The state machine 90A rotates the amplifier stage that has most recently been calibrated to take the place of the amplifier least recently calibrated on a periodic basis. The CSA 90 produces outputs comprising a balance signal BAL for balancing currents in the two channels, two overcurrent limits OCLIMIT1 and OCLIMIT2 to prevent overcurrents in the two channels and the signal DROOP for active voltage positioning (AVP). It receives inputs from the two channels via inputs CS1, VO1 and CS2, VO2 and the temperature dependent signal IPTC from the thermal interface 240. The CSA 90 also produces an offset compensation signal to internally trim the variable gain amplifiers for any offsets.

Figure 4:
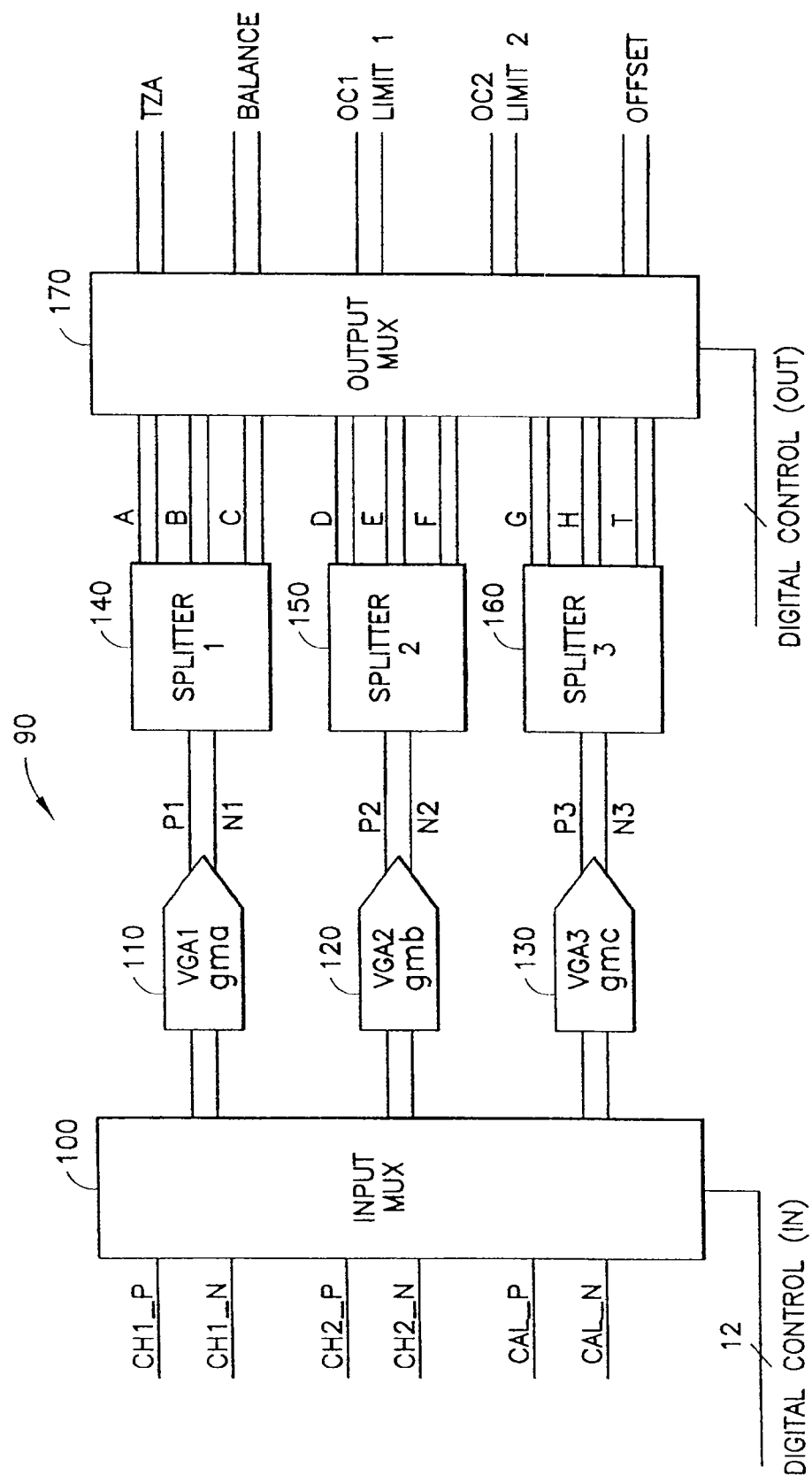
FIG. 4 is a block diagram of the current sense amplifier according to the present invention.

FIG. 4 is a block diagram of the overall circuit of the current sense amplifier. As shown, the circuit includes an input multiplexer 100 which receives six inputs, channel 1 P and N, channel 2 P and N and a calibration input, calibration P and N. The latter two inputs are not external terminals of controller 10. The input multiplexer is controlled by a digital control signal comprising a 12-bit signal from the current sense amplifier multiplexer control state machine.

The input multiplexer chooses inputs in a sequence from amongst the channel 1, channel 2 and calibration inputs to be provided to the three variable gain amplifiers 110, 120 and 130. The two current sense channels are always provided to two selected variable gain amplifiers (VGAs) at the same time while the third VGA is being calibrated. The outputs of the variable gain amplifiers are P1 and N1, P2 and N2 and P3 and N3. As described above, at any one time, two VGAs are in service monitoring the two input channels while the third is in calibration. FIG. 6 shows the state table. As shown in FIG. 6, there are six states. In state 1, channel 1 and channel 2 are connected, respectively, to VGAs 1 and 2. The VGA 3 is in a calibration mode. In state 2, VGA3, which was the most recently calibrated, replaces VGA1 which was the VGA that was calibrated least recently. The VGA1 is calibrated in state 2. VGA2 maintains connection to channel 2. In state 3, VGA2 is calibrated and VGA1 rotates to the channel 2 position. VGA3 is not changed. In state 4, now VGA3 was the least recently calibrated so accordingly VGA3 is now calibrated, VGA1 remains connected to channel 2 and VGA2 replaces VGA3 and is now connected to channel 1. Similar rotation occurs for state 5 and state 6 and then after state 6 the states repeat again as shown.

Figure 21:
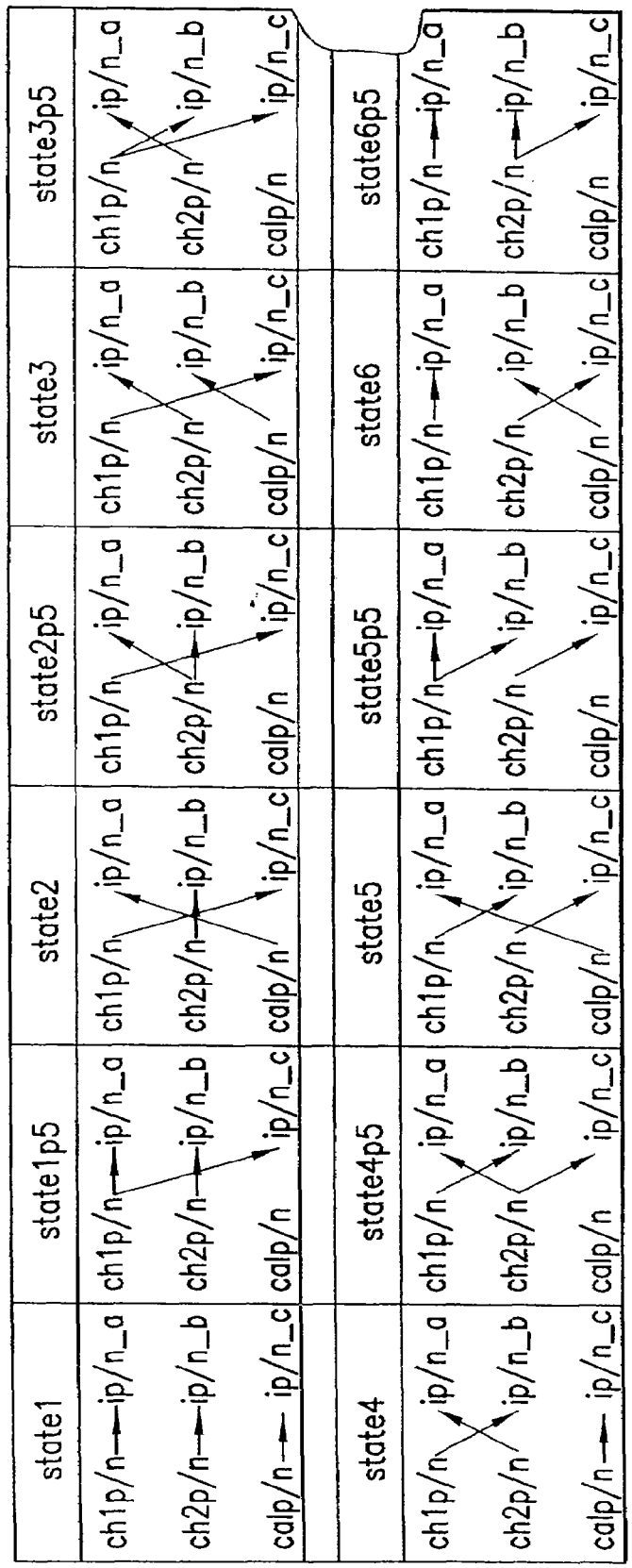
FIG. 21 shows the states and state changes implemented by the input multiplexer.

FIG. 21 shows the input multiplexer connections and the changes of states from one state to the next corresponding to the state table shown in FIG. 6.

Returning to FIG. 4, the outputs of each of the respective VGAs 110, 120 and 130 are provided to current splitters 1, 2 and 3 (140, 150 and 160) which provide the gain adjusted currents to the output multiplexer 120 which provides these currents under digital control of the state machine controller 90A to a transimpedance (TZA) amplifier, a current balancing circuit and an over-current protection circuit (LIMIT 1 and LIMIT 2) as well as an offset signal to an offset trimming circuit.

As discussed above, one VGA is always in a calibration mode. The calibration sequence includes an offset trimming routine that uses a successive approximation register (SAR) to provide VGA offset calibration which will be described in connection with FIG. 19 followed in time by a temperature calibration routine, as shown in FIG. 20, that adjusts the gain to compensate for the temperature coefficient of the inductor resistance.

Figure 19:
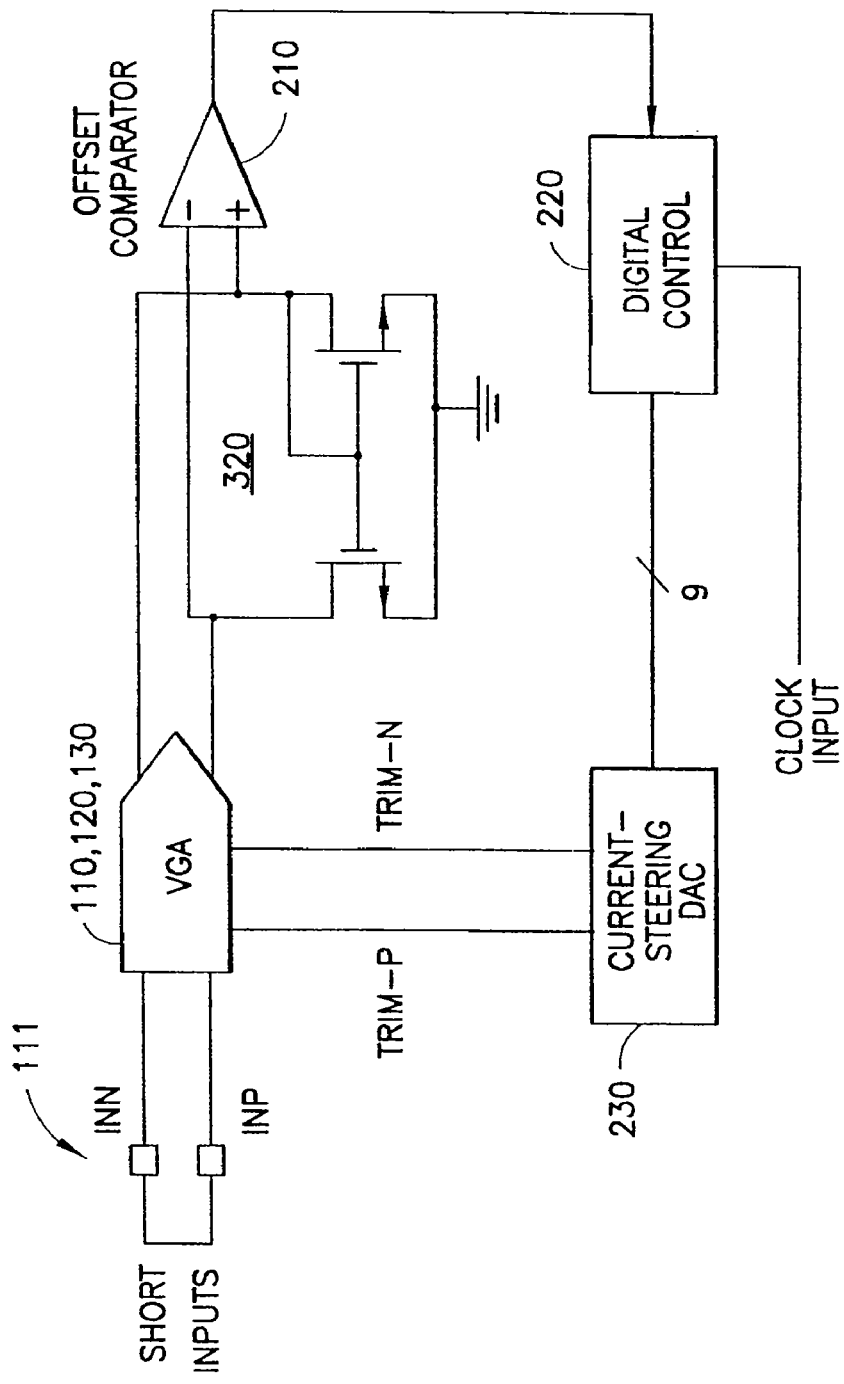
FIG. 19 shows a snapshot in time of the offset voltage calibration procedure.

FIG. 19 shows a snapshot in time of the offset voltage calibration that is performed for each VGA 110, 120 and 130 when in calibration mode. The offset calibration is performed in order to adjust for offset voltage in the VGA to maintain its accuracy. This is done by trimming current through a resistor at the differential inputs of the VGA. In order to perform the offset calibration, the inputs to the VGA are shorted as shown at 111 in FIG. 19. The input multiplexer 100 is not shown in FIG. 19, but the inputs are shorted by shorting the inputs CALP and CALN of FIG. 4 for the VGA that is being calibrated. The output of the VGA, which comprises differential outputs, are equalized by the offset calibration circuit shown, which comprises a comparator 210, successive approximation register (SAR) and control logic 220 and current steering DAC (Digital to Analog Converter) 230 to implement the offset calibration. The differential outputs of the VGA are fed into a current mirror 320 and to an offset comparator 210. The output of the comparator 210 is provided to a digital register 220 which controls a current steering digital to analog converter 230. The output of the DAC 230 is a differential current that is steered into the VGA to compensate for offset. There are three DACs, one for each VGA. The outputs of the DAC 230 are TRIM-P and TRIM-N, the purpose of which will be clearer in connection with FIG. 22.

Figure 20:
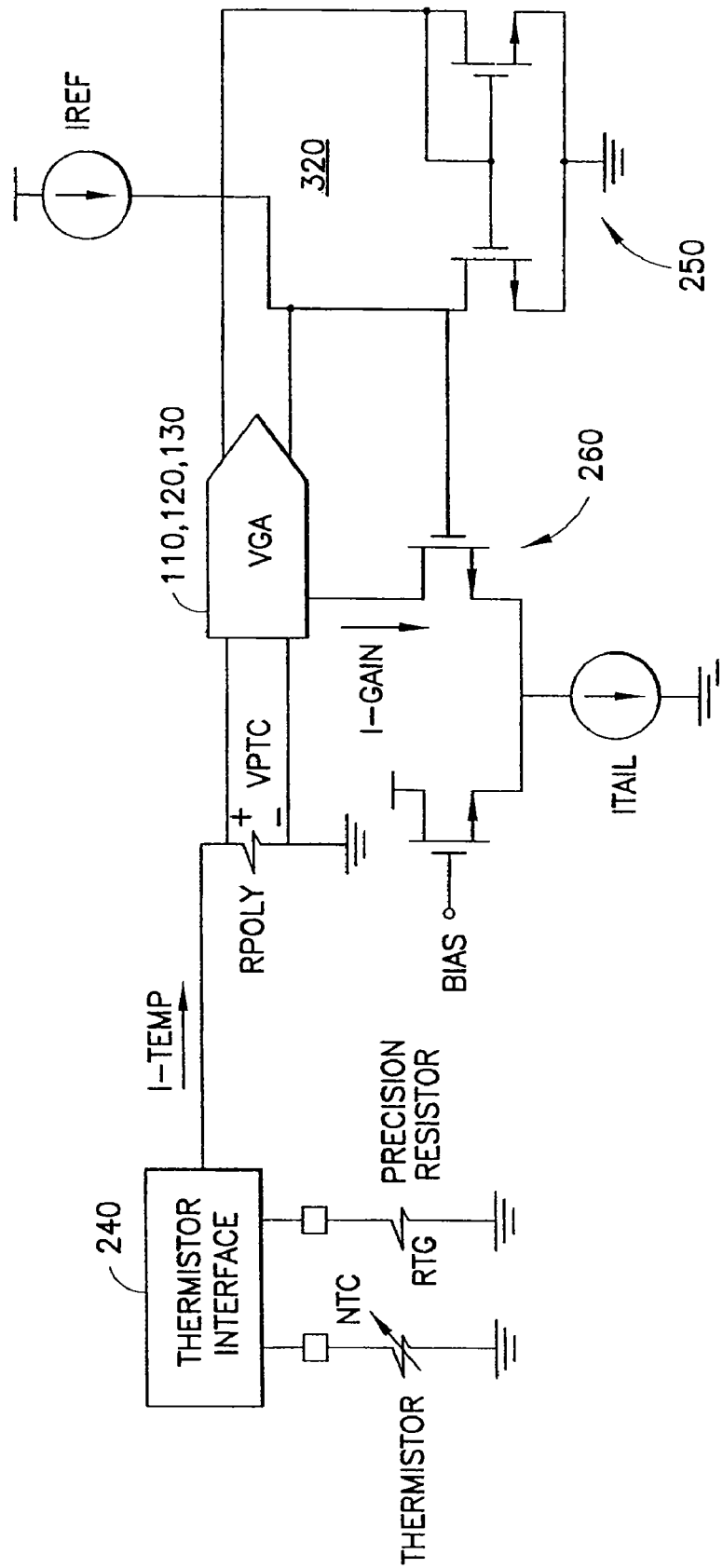
FIG. 20 shows a snapshot in time of the thermal gain calibration procedure.

The VGA offset calibration is followed by a temperature calibration, shown in FIG. 20. The temperature of the inductor is obtained by an external thermistor NTC. Only one thermistor is shown for the two channel converter of FIG. 2. An additional thermistor can be provided, for example, for the second channel with the addition of further circuitry. Furthermore, more thermistors can be provided if the converter has additional channels. A precision resistor RTG converts a current reference supplied internally by the IC to a voltage reference. See FIG. 2. The input of the VGA under calibration is adjusted by the temperature signal I-TEMP from the thermistor interface 240. The VGA is locked in a feedback loop with its output forced to a constant level by current source IREF. The loop controls the gain such that the VGA produces a constant output level even under the condition of an input that varies with temperature. The gain control voltage is sampled during this calibration and subsequently held on a sample-hold capacitor within the VGA.

The output of the thermistor interface 240 is a current comprising a temperature signal I-TEMP which is provided through a resistor RPOLY to produce an input voltage to the VGA under calibration. The VGA differential output current is converted to single ended by current mirror 250. This single ended current is bucked against IREF, the difference in these currents drives source coupled pair 260 (provided with a static bias (BIAS) to produce gain control signal I-GAIN. The I-GAIN signal adjusts VGA gain based on the thermal input.

The digital state machine 90A controls the calibration sequence and rotation of the amplifiers. The input multiplexer 100 and output multiplexer 170 allow the configuration of three VGAs in the six different states shown in FIG. 6. After a programmable wait period, for example 2 milliseconds, a VGA is calibrated. Immediately following calibration, the calibrated VGA replaces the least recently calibrated VGA in service. A make before break connection is used at the inputs. This allows the calibrated amplifier to connect to the input channel and settle before its output replaces the VGA previously in service. In this way, offset calibration and temperature compensation are refreshed every 2 milliseconds.

The output of each VGA comprises a differential current signal. This signal is the input to a respective current splitter 140, 150 160 (FIG. 4), each of which is a set of current mirrors optimized for accurate matching. The output of each current splitter is three essentially identical differential current signals: A, B and C; D, E and F; and G, H and I. There are three current splitters, one for each VGA. These output currents are supplied to the output multiplexer 170, as shown in FIG. 4.

The output multiplexer then provides five differential output signals TZA, balance, LIMIT 1, LIMIT 2 (both for overcurrent) and offset.

Figure 5:
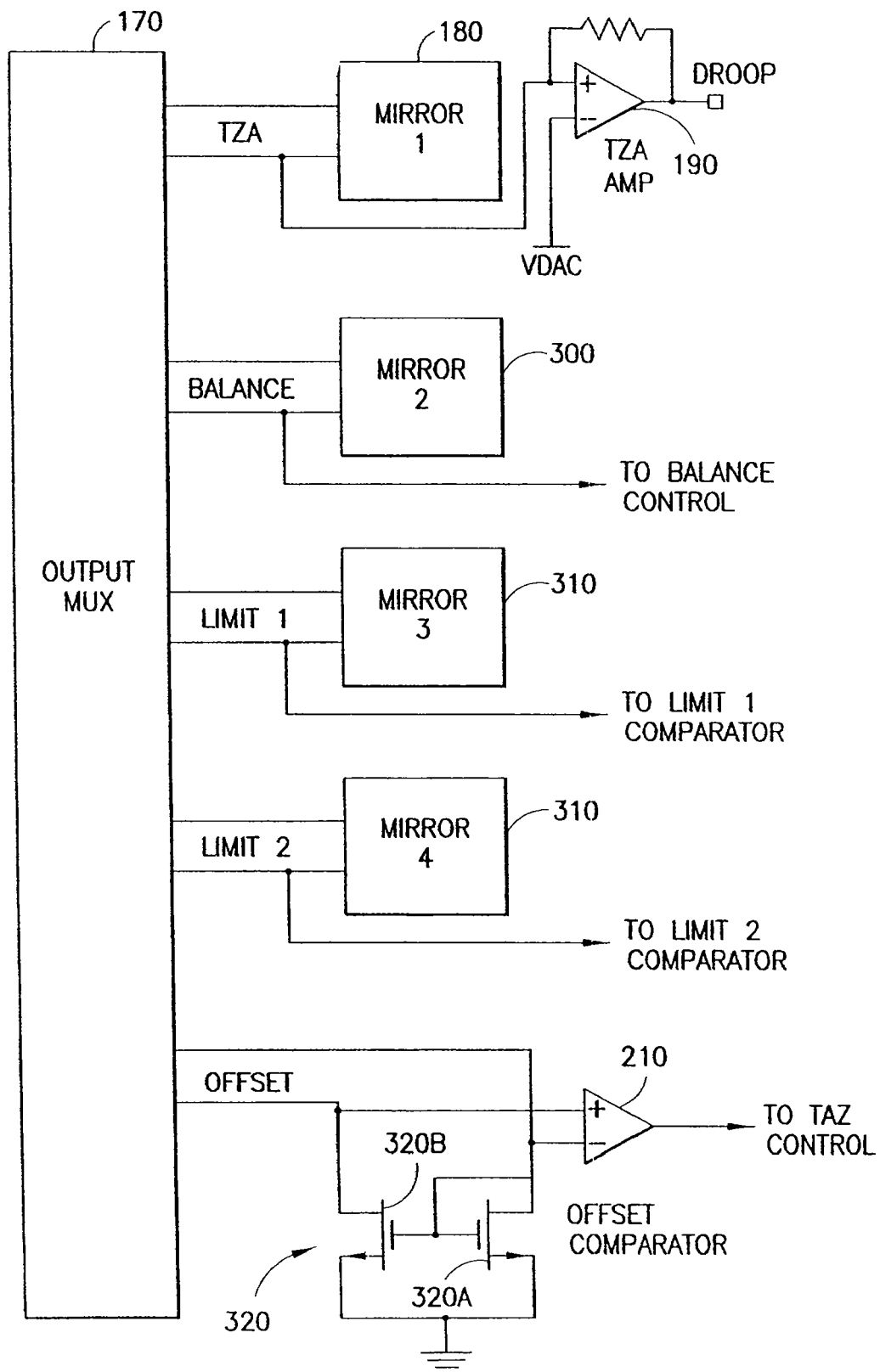
FIG. 5 is a block diagram of a portion of the output circuit of the current sense amplifier according to the present invention.

Turning now to FIG. 5, output multiplexer 170 provides the outputs of the VGAs on five output channels TZA, balance, LIMIT 1, LIMIT 2 and offset.

Two pairs of differential current signals, one from each channel, are summed and then applied to a wide compliance current mirror 180 to produce a single ended current that is proportional to the total current delivered by the multiphase-converter. This single ended current is supplied to the transimpedance amplifier (TZA AMP 190) which produces the DROOP signal used to adjust the load line of the voltage output. This signal is used to cause the output voltage to decrease with increasing load current and is also known as adaptive voltage positioning (AVP). This signal is present on the DROOP output pin in FIGS. 2 and 3 and is fed back to the feedback input to cause the output voltage to decrease with increasing load current.

The next two pairs of differential current signals from the current splitters (one from each channel) are subtracted to produce a signal labeled BALANCE in FIG. 5 before being applied to a wide compliance current mirror 300 to produce a single ended current that is proportional to the difference in current delivered by the two channels. This signal is used to balance the current delivered by each channel of the converter. Referring to FIGS. 2 and 3, this is present at the signal BAL. The BAL signal is provided to one or both the ramp generators 52 to affect the PWM ramp (RAMP) to balance the currents in the outputs, thereby balancing the current delivered by each channel of the converter.

The third pair of differential current signals from each current splitter, i.e., for each channel, are applied to respective wide compliance current mirrors 310 to generate two single ended signals used for current limiting each channel. These signals are labeled LIMIT 1 and LIMIT 2 and are provided to line OC (overcurrent) 54 in FIG. 3 to the block labeled DAC AND RATE CONTROL 56 to set an overcurrent limit.

Finally, the output of the VGA130 (FIG. 4) in calibration is applied to a current splitter 160. One differential current is applied to a simple, accurately matched cross-quad current mirror 320 for the offset trimming. The SAR offset comparator 210 of FIG. 19 is coupled across this current mirror. Diode connected device 320A of the current mirror 320 is applied to the positive comparator input while the output of the mirror is applied to the negative input. No early voltage error is incurred since the SAR routine drives the inputs of the comparator 210 to be equal. This happens when the drain-source voltage of the mirror device 320B equals the gate-source voltage of the diode connected mirror device 320A.

A second differential current output of the current splitter 160 of FIG. 4 is used to close the feedback loop around the calibrated VGA during thermal compensation. This is shown in FIG. 20 by the mirror 250 and has been previously described.

Figure 7:
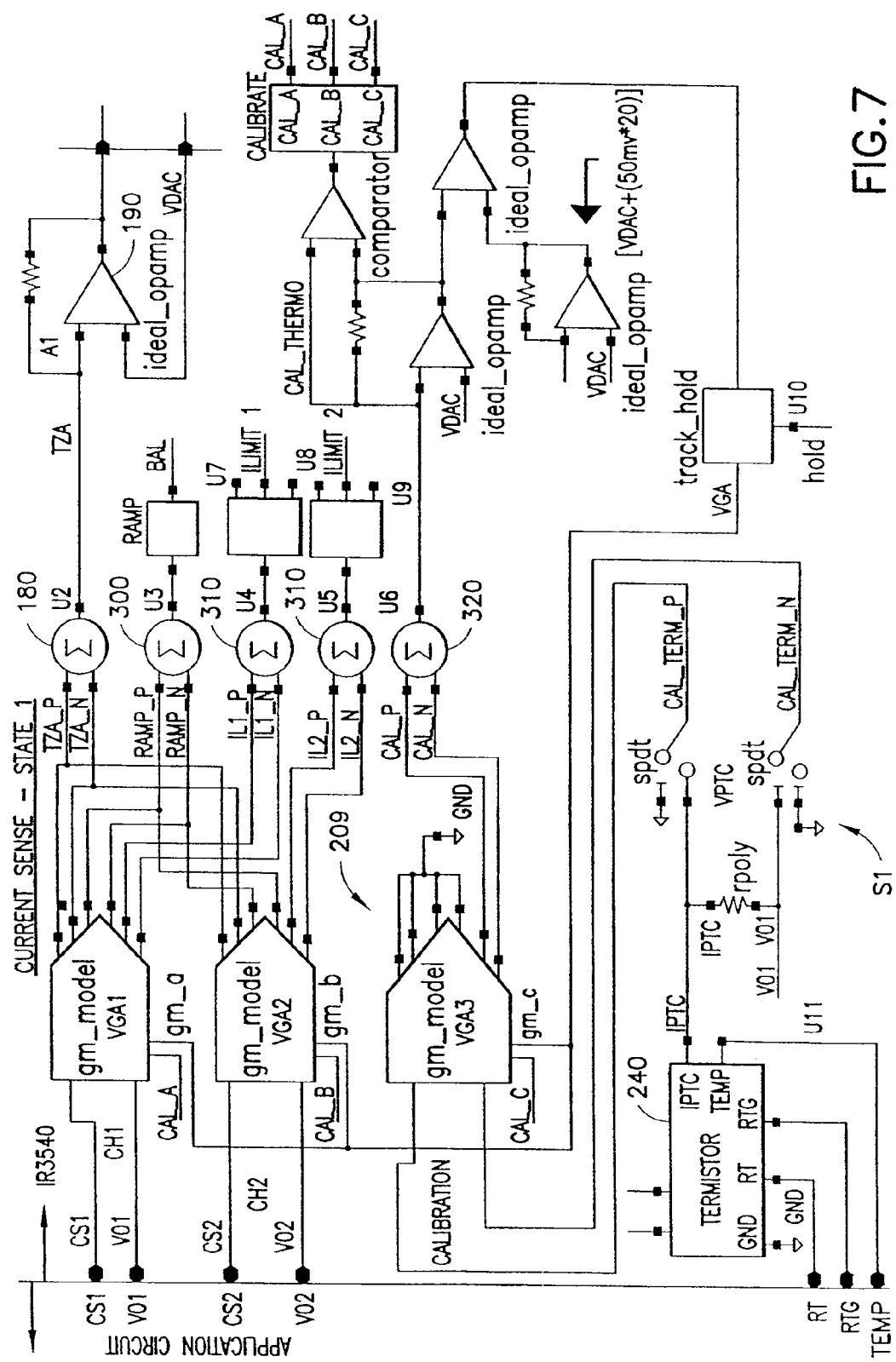
FIG. 7 shows a block diagram of the current sense amplifier in state 1 with the multiplexers not shown for clarity.

Returning to the state table of FIG. 6 and referring to FIG. 7, FIG. 7 shows a snapshot in time of the current sense amplifier in state 1. As shown, the three VGAs, VGA1, VGA2 and VGA3, in state 1 are coupled such that VGA1 has channel 1 as the input, VGA2 has channel 2 as the input and the remaining VGA3 is in calibration. In FIG. 7, the input multiplexer 100 as well as the output multiplexer 170 are not shown as they are merely switches and transparent. The input multiplexer 100 connects the differential inputs of each of the VGAs to the channel 1 (CS1 and VO1) and channel 2 inputs (CS2 and VO2) and thermistor NTC cell 240 output current node IPTC. An electronic switch S1 (part of the input multiplexer 100) connects the thermistor signal IPTC and VO1 to the VGA inputs. The signal IPTC is a current with a positive temperature coefficient. The three identical differential current outputs from the current splitters (not shown in FIG. 7) are coupled by the output multiplexer 170 to the current mirrors previously described with reference to FIG. 5 that convert the differential signals to single ended signals. These current mirrors are represented in FIG. 7 at U2 to U6. In FIG. 7, the current splitters 140, 150 and 160 have been incorporated into the depicted VGAs. As shown in FIG. 7 at 209, during calibration, the other two differential pairs of the VGA in calibration are shorted.

Figure 8:
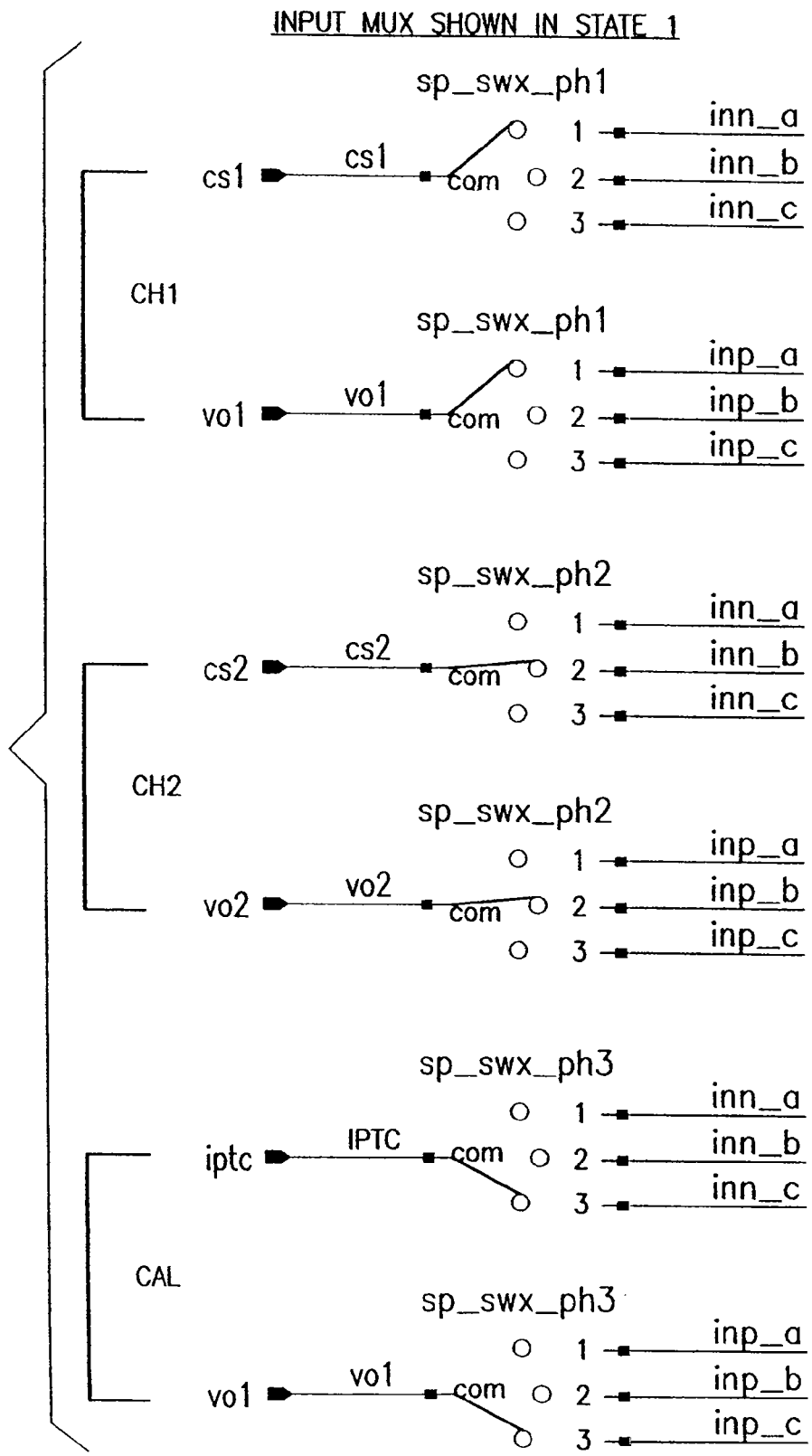
FIG. 8 shows the input multiplexer in state 1.
Figure 9:
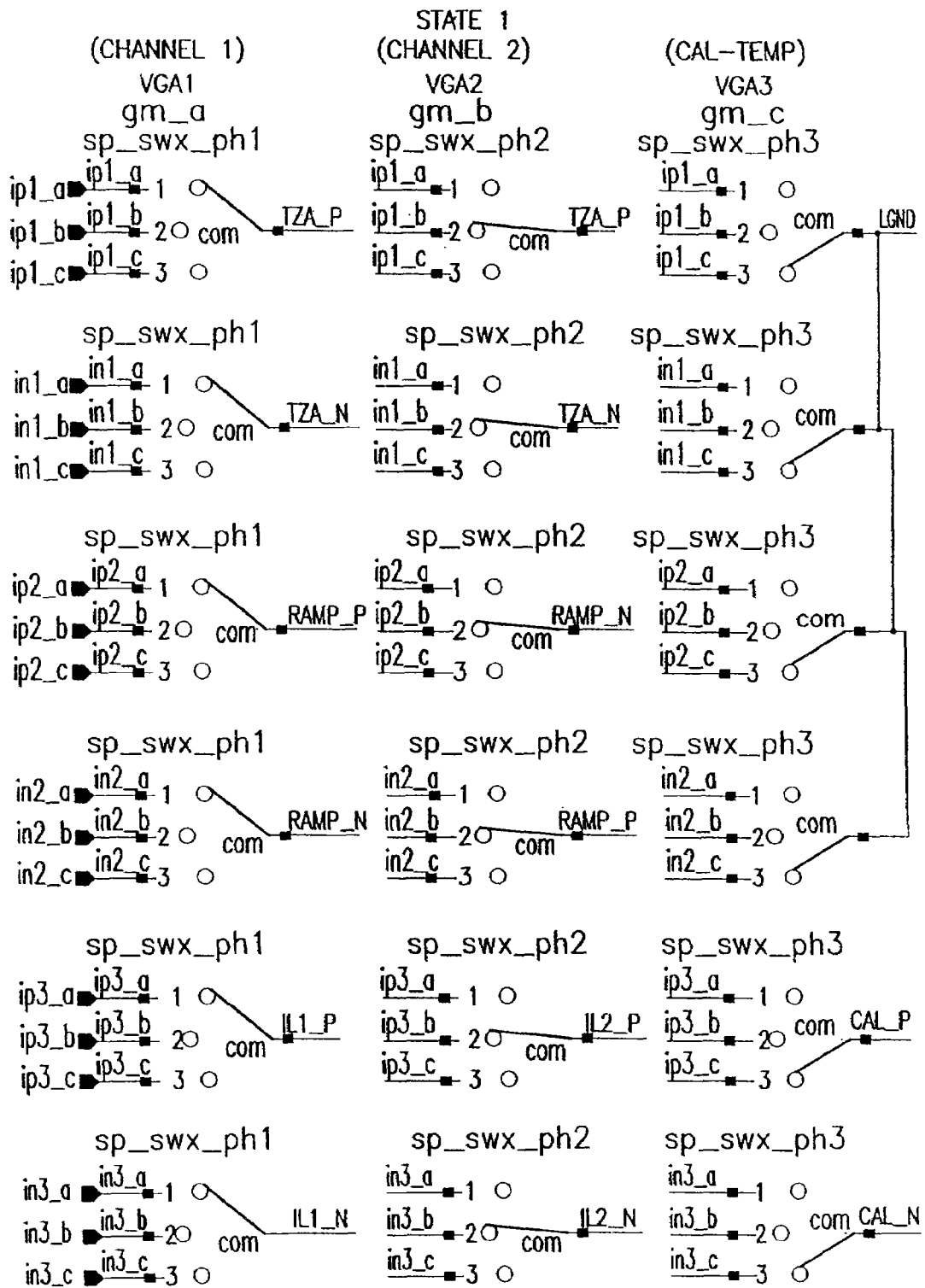
FIG. 9 shows the output multiplexer in state 1.
Figure 10:
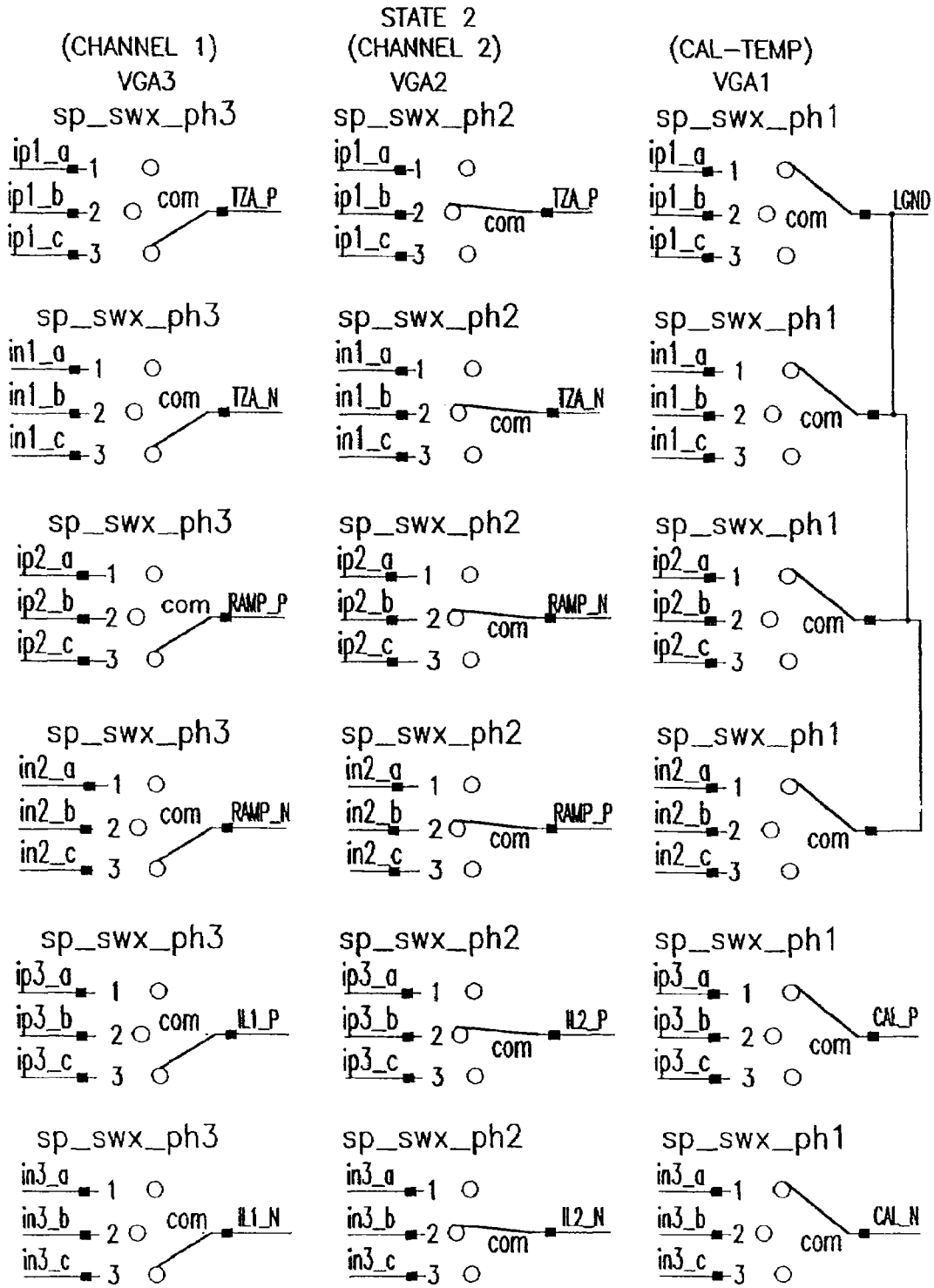
FIG. 10 shows the output multiplexer in state 2.
Figure 11:
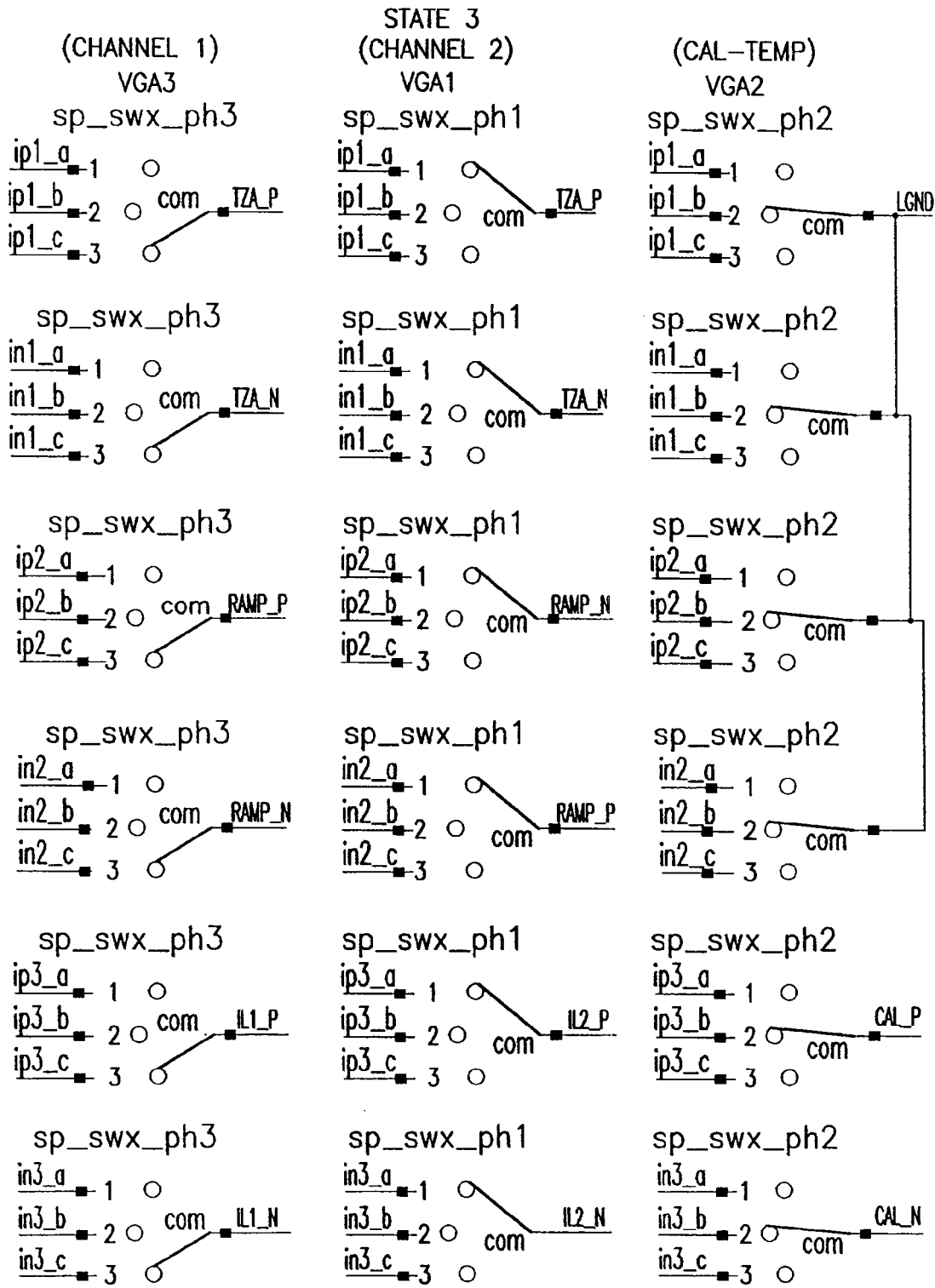
FIG. 11 shows the output multiplexer in state 3.
Figure 12:
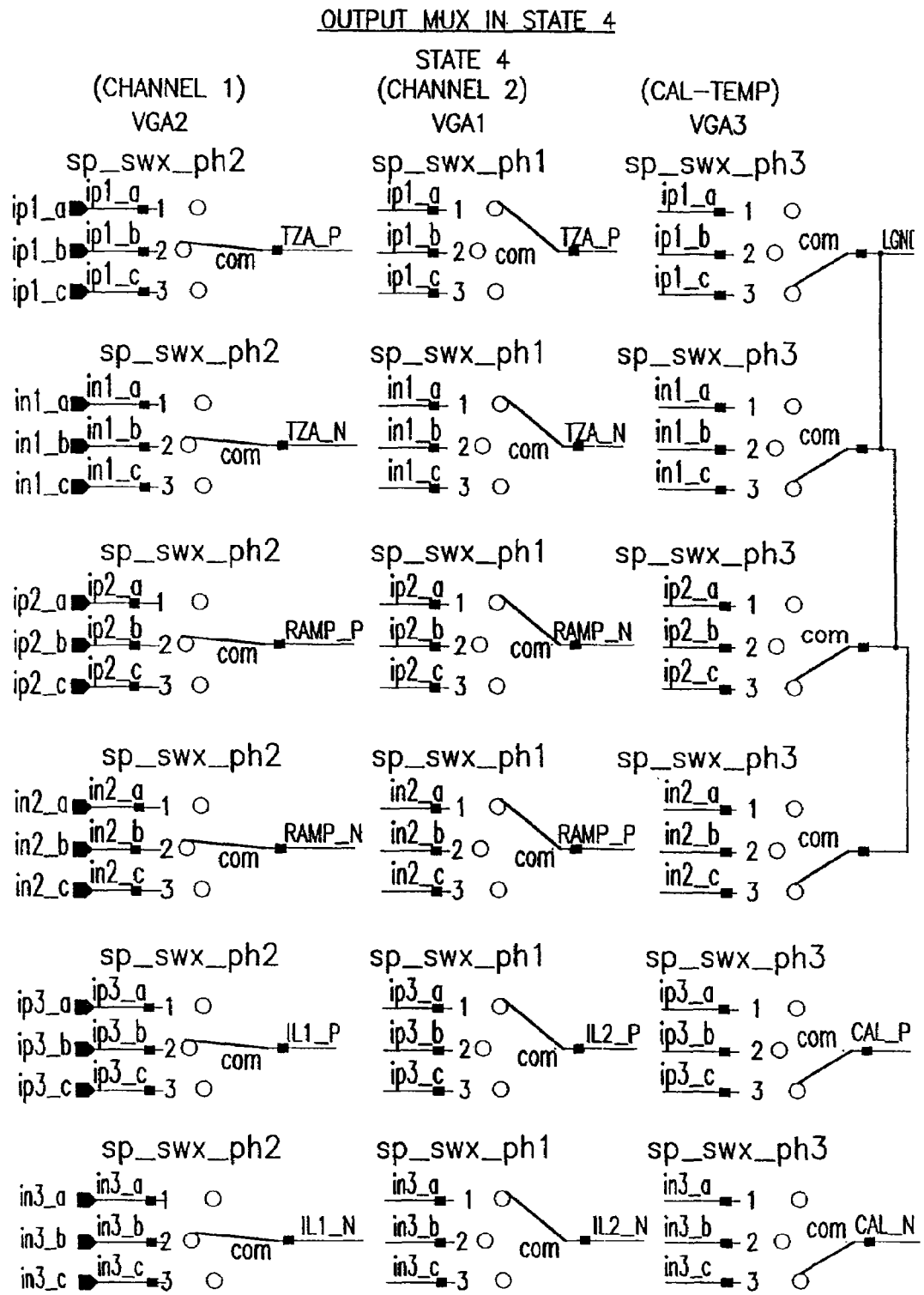
FIG. 12 shows the output multiplexer in state 4.
Figure 13:
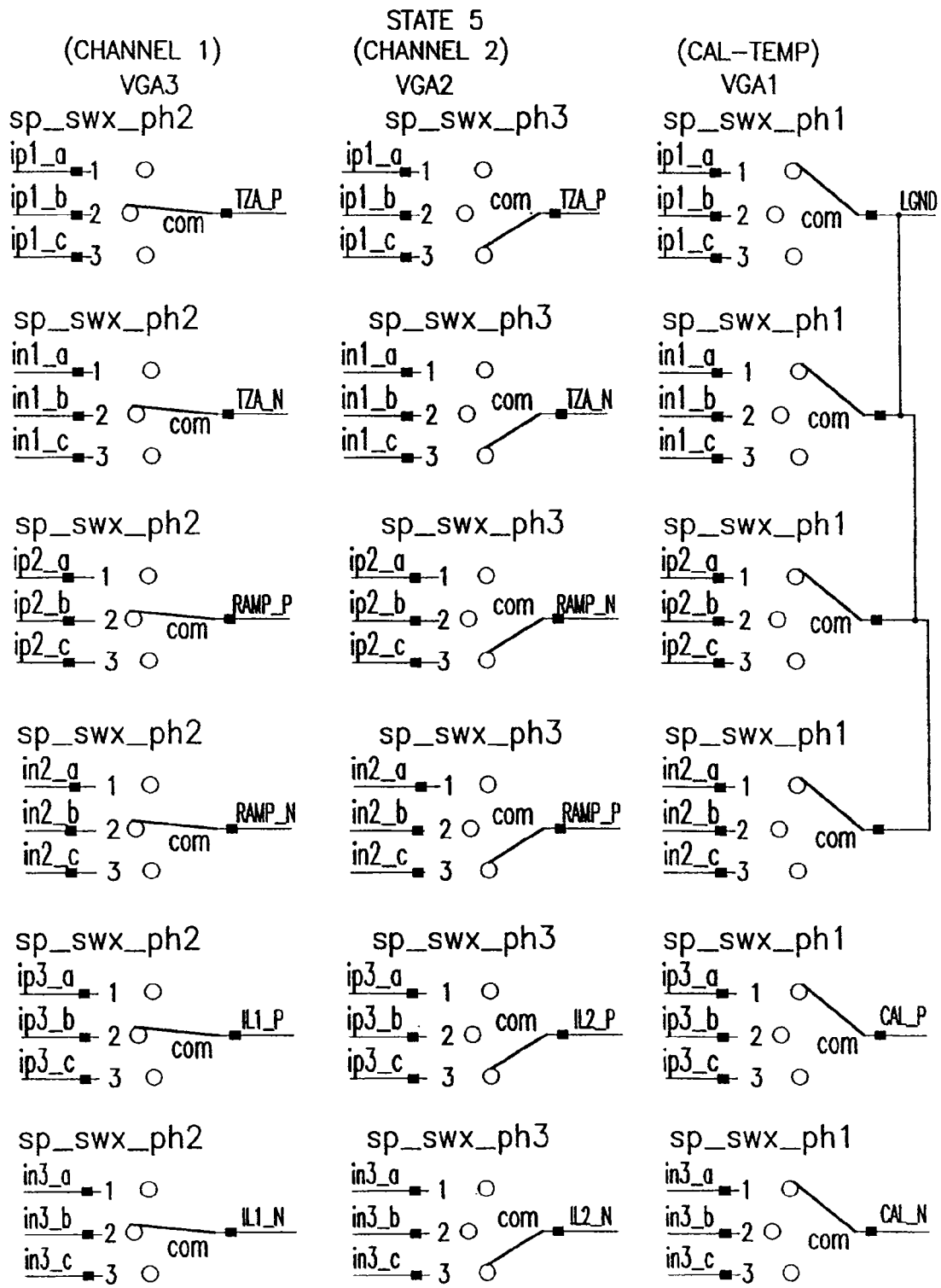
FIG. 13 shows the output multiplexer in state 5.
Figure 14:
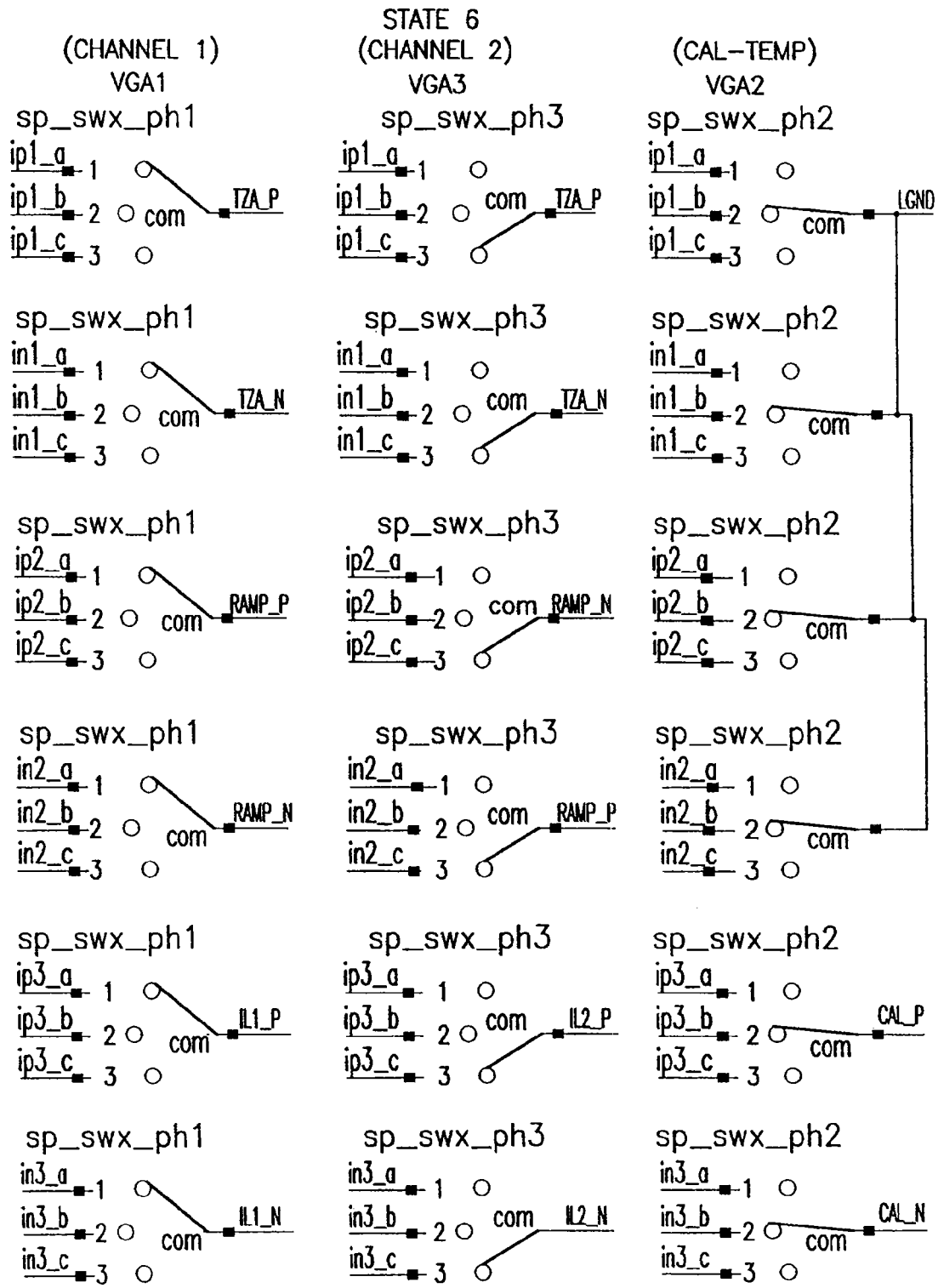
FIG. 14 shows the output multiplexer in state 6.

FIG. 8 shows the input multiplexer in state 1. As shown, inputs CS1 and VO1 are provided to the inputs of VGA1. The channel 2 inputs CS2 and VO2 are provided to the VGA2 inputs and the thermal input across IPTC and VO1 is provided to the third VGA. IPTC is derived from the thermal interface circuit 240 connected to NTC (PIN RT) and RTG (FIG. 2), referenced to VO1.

FIGS. 9 through 14 show the output multiplexer in each of the six states. As shown, for example in FIG. 9, in state 1, the first differential pair from VGA1 is provided to the TZA as is the first differential pair of VGA2. The first differential pair of VGA3 is shorted.

The second differential pairs from VGA1 and VGA2 are provided to form the balance signal which is supplied to one or both the ramp generators 52 in FIG. 3 to balance the currents in each of the channels. These are designated as RAMP P and RAMP N in FIG. 9.

The third differential current pairs of VGA1 and VGA2 form the current limit signals as discussed earlier and are used to form the overcurrent protection signal OC.

The second pair of differential current signals from VGA3, in calibration, are also shorted and connected to the first pair. The last pair of differential current signals from VGA3 is provided to the calibration input for the offset generation as described with reference to FIG. 5 and subsequently for thermal calibration. Alternatively, a further current splitter output could be used for thermal calibration.

The remaining FIGS. 10 through 14 show the connections of the output multiplexer in the other states 2 to 6 and are apparent from the diagrams and need not be described in further detail herein.

Figure 15:
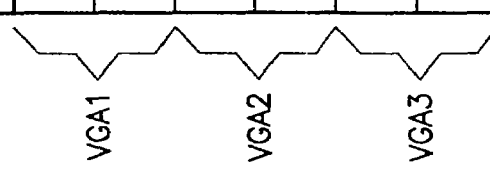
FIG. 15 shows the connections of the input multiplexer for the various states.

FIG. 15 shows the input multiplexer table and summarizes the connections of the VGAs in the various states. For example, in state 1, VGA1 has its inputs connected to channel 1, VGA2 has its inputs connected to channel 2 and VGA3 has its inputs connected between VOUT and IPTC, that is, the output of the thermistor cell. In state 2, because VGA1 was the least recently calibrated, it is now in calibration, and VGA3 now replaces VGA1. VGA2 remains connected to channel 2 and VGA3 is now connected to channel 1. To provide one further example, in state 3, VGA2 is now in calibration, VGA3 remains connected to channel 1 and VGA1 is now connected to channel 2.

FIGS. 16 to 18 show the output multiplexer tables for each of VGA1, VGA2 and VGA3, respectively. For example, in FIG. 16, IP1A, IN1A, IP2A, IN2A and IP3A, IN3A are outputs of VGA1 of FIG. 7 (or the three differential current outputs A, B and C of splitter 140 of FIG. 4). These tables further summarize the connections that have been previously described. In each of FIGS. 16-18, the input connection of the VGAs are summarized in the top three rows, and the output connections are summarized in the bottom six rows.

Figure 22:
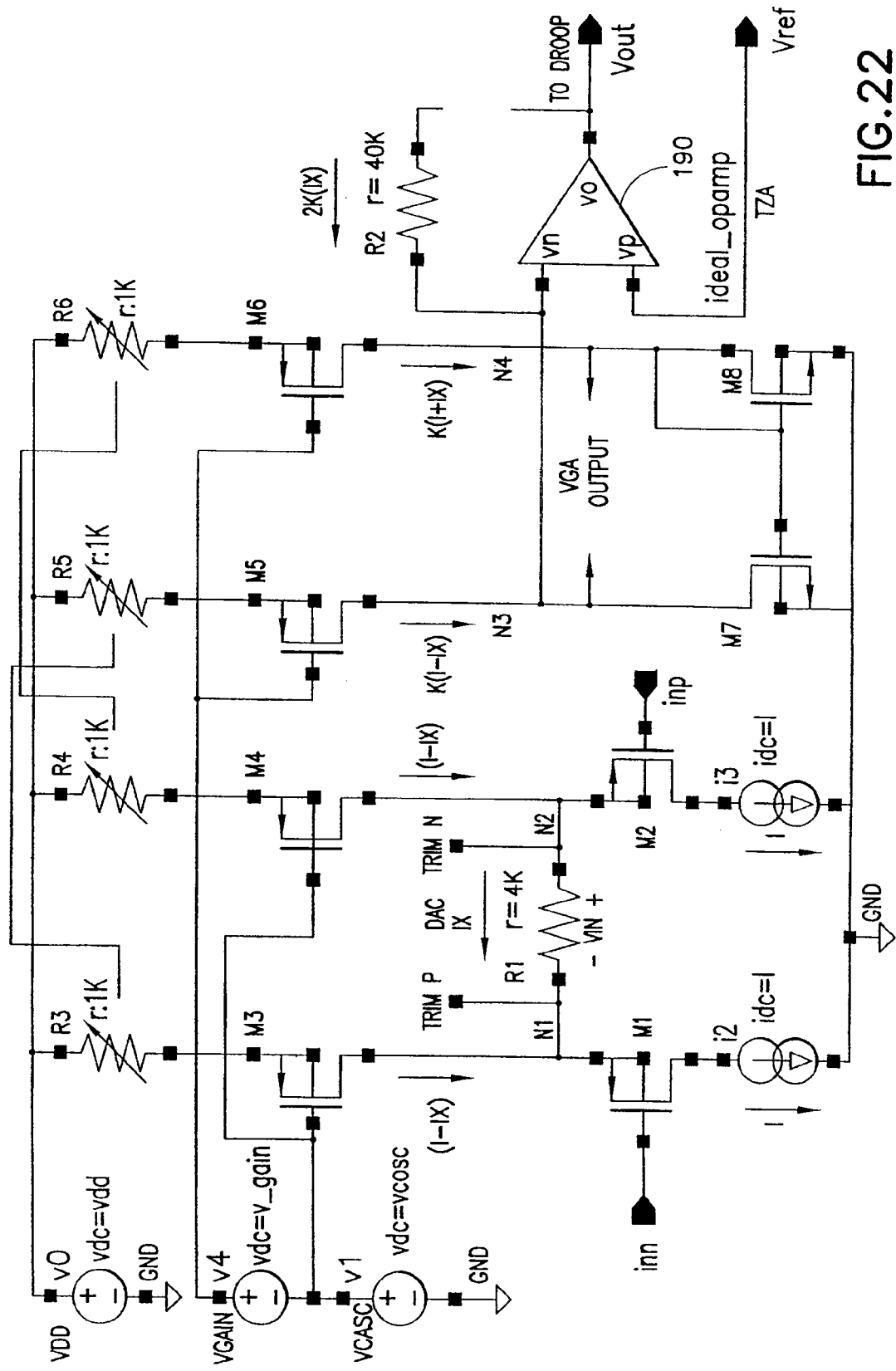
FIG. 22 shows the variable gain amplifier concept model.

Turning now to FIG. 22, this figure describes the conceptual operation of each VGA. The VGA is designed to provide variable gain, a wide input common-mode range which includes ground, a wide differential signal range and an output that can be referred to a widely variable level indicated by VREF.

Each VGA accommodates a bipolar differential input signal range of minus 100 millivolts to plus 100 millivolts. This range is too broad for a bipolar multiplier without signal compression.

As in standard transconductance (GM) cell front ends, a pair of input devices M1 and M2 are driven at a constant current by sources I2 and I3. This means that for matched devices, the differential input signal will appear across resistor R1. In this way, the transconductance is set to 1/R1. The VGA inputs are Inn and Inp. Devices M1 and M2 are sized for large transconductance to minimize error.

The VGA circuit is symmetrical and operates the same way for both positive and negative input signals. For a positive signal, current IX through resistor R1 equal to VIN/R1 flows through R1 in the direction shown. For a negative signal, the current would flow through R1 in reverse. The current shown forces cascode M4 to carry current I+IX and cascode M3 to carry I−IX where I is the constant bias current forced through the input pair devices M1 and M2 by current sources I2 and I3.

Resistors R3, R4, R5 and R6 represent MOSFETS operated in the triode mode. They are electronically variable resistors. The resistance of R3 is adjusted such that it carries the I−IX current of M3 while the resistance of R4 is adjusted such that it carries the I+IX current of M4.

Voltage source V1 has a value of VCASC volts which is applied to the gates of M3 and M4. This voltage source along with M3 and M4 sets the voltage across R3 and R4.

Voltage source V4 represents the gain control voltage and together with M5 and M6 sets the voltage across R5 and R6. The voltage of source V4, labeled as VGAIN, can be positive, negative or zero. When it is set to zero, the voltage drops across all variable resistors R3 through R6 inclusive are the same.

Variable resistors R3 and R5 are driven by the same electronic control signal. Similarly, resistors R4 and R6 are driven by the same control signal. Resistors R3, R4, R5 and R6 are also set to match and track in physical layout.

Since resistor R5 tracks R3, for VGAIN set to zero, M5 will carry the same current as M3 (I−IX). Similarly, since resistor R6 tracks R4, M6 will carry the same current as M4 (I+IX).

For non-zero values of the gain, the current in the back end devices M5 and M6 will be a scaled version of the current in the front end devices M3 and M4. The scale factor is shown as K in FIG. 22 and can be greater or less than 1. Thus, current K (I−IX) flows in M5 and current K (I+IX) flows in M6.

Devices M7 and M8 form a current mirror that converts the differential input signal to a single ended signal. In this way, the bias current is subtracted and the resulting signal current 2KIX flows through the feedback resistor R2 which is connected in a feedback loop around operational amplifier 190 which comprises an ideal operational amplifier functioning as the transimpedance amplifier TZA 190. The output multiplexer 170 is transparent, and not shown. The output VOUT comprises the signal DROOP of FIG. 5. It is also shown in FIG. 3.

The output is VOUT=2KIXR2 where IX=VIN/R1 so that the resulting gain is VO/VIN=2K(RT/R1). The output signal of the VGA is referred to the voltage applied to the reference input of the OPAMP 190 which is shown as VREF.

As previously described, to adjust the offset of the VGA, the current through resistor R1 is trimmed by the current steering DAC 230 of FIG. 19, which has its analog output connected across the resistor R1, which comprises the terminals TRIM-P and TRIM-N. See FIGS. 19 and 22. By adjusting the current in R1, such that the current through R1 is 0, when the inputs to the VGA are shorted, the offset of the VGA is compensated.

FIGS. 23, 24 and 25 together show a schematic diagram of each VGA. FIG. 23 shows what is referred to herein as the VGA front end, FIG. 24 shows what is referred to herein as the back end and FIG. 25 shows the bias circuit. These figures implement the VGA concept model shown in FIG. 22. There is some overlap between FIGS. 23 and 25. Letters A-L indicate corresponding connection points between the two figures.

In particular, the VGA front end includes the transistors M1 and M2 labeled similarly as in FIG. 22. Resistor R1 sets the gain and corresponds to resistor R1 in FIG. 22. Transistors M5 and M5A correspond to variable resistor R3 in FIG. 22 and transistors M6 and M6A correspond to variable resistor R4 in FIG. 22.

With zero differential input current between the gates of M1 and M2, current I is carried by both M1 and M2. Half this current, (I/2) is carried by the static triode FETs M5 and M6. The DAC 230 of FIG. 19 supplies a current through R1 to compensate for offset.

OPAMP I250 drives the gate of M5A (node N11) to vary its resistance such that current in R14 and M1 is constant with varying input signal. OPAMP I251 drives the gate of M6A (node N12) such that the current in R24 and M2 is constant.

OPAMP A2-1 drives the sources of M5 and M5A to voltage NCASC. This eliminates the error that would otherwise be incurred by the gate-source voltage of cascode M3 which varies over signal current, temperature and process. OPAMP A2-2 serves the same function for triode FETs M6 and M6A.

The cascode devices along with their associated OPAMPs ensure that M5, M5A, M6 and M6A operate in the triode region. A nominal drain-source voltage of 100 millivolts is maintained.

The triode FETs are broken into a static device and a variable resistance device. This is done so that the control loop cannot push the branch into a zero current state and so avoids a startup problem. It also avoids stability problems by reducing coupling between two feedback loops, one controlling M5A and the second controlling M6A.

The coupling element between the two loops is resistor R1. Bias is set such that even with maximal differential input voltage, current through resistor R1 cannot turn off or saturate either the M5A or M6A feedback loops.

Cascode voltage at node NCASC is generated by pulling a system reference current through R30, shown in FIG. 25. The system current is generated by applying the bandgap reference voltage across a polyresistor. Since R30 is another polyresistor, the voltage across it has an accuracy limited by the bandgap accuracy and the resistor matching accuracy.

This provides an accurate cascode voltage that is referenced to the positive supply rail VDDL.

FIG. 24 shows the VGA back end schematic. In the back end, devices M11 and M11A correspond to variable resistor R5 in FIG. 22 while devices M12 and M12A correspond to variable resistor R6.

OPAMP I250 that drives front end device M5A also drives back end device M11A through node N11 so that they track in resistance.

OPAMP I251 that drives front end device M6A also drives back end device M12A through node N12 so they track in resistance.

The gain control input signal through the VGA is current I-GAIN which is drawn through resistor R0 to create a cascode voltage for the back end devices in a manner similar to the front end technique. The ratio of front end to back end cascode voltages adjusts the gain corresponding the scale factor K in FIG. 22.

The gain control voltage is held on capacitor C2. The track-hold switch is composed of transistors M10 and M11.

When a fixed gain is desired, the back end cascode node VGAIN is shorted to the front end cascode voltage NCASC by switch M14 which is coupled between NCASC and VGAIN. This sets the gain to twice the ratio of transimpedance amplifier feedback resistor (100 K ohms) to VGA GM resistor (10K) for a gain of 20. The factor 2 comes from the 2 to 1 mirror applied to the output pins N1 and P1 which correspond to the outputs of the variable gain amplifier. The outputs of the variable gain amplifier correspond to the drain currents of M6 and M7.

When a variable gain is desired, i.e., when the VGA is being calibrated, the track-hold switch M10/M11 connects the VGAIN node to resistor R0 so that the I-GAIN signal has control. The gain is then adjusted as outlined with respect to FIG. 20.

Once the calibrated amplifier has had time to settle, the track-hold switch (M10/M11) opens the connection to resistor R0 and the gain control voltage is held on hold capacitor C2. Now the calibrated amplifier can be rotated into service. The update rate is on the order of 2 milliseconds which is significantly faster than temperature changes.

FIG. 25 shows the VGA transistor bias circuit. The block 400 comprises a bank of wide compliance current mirrors. Its input is the system reference current. It provides bias to the op amps internal to the VGA as well as the current for the cascode reference.

In the VGA bias schematic of FIG. 25, amplifier A4, M65 and resistor R35 convert the NCASC voltage to a current which is driven through R16 to provide a voltage reference for op amps I250, 251. This sets the reference for the nominal current in the variable devices M5A and M6A.

The same R16 reference is applied to op amp A3 which drives the gate (node N10) of M71 as well as the front end static triode devices M5 and M6 and back end triode devices M11 and M12. Device M71 is sized the same as M5 since it carries the same current as M5 and M72 is sized at half the size of cascode device M3 since it carries half the current of M3.

Current from M72 is passed through R36 which is twice the values of R4, R6 and R14. This causes amplifier A3 to drive node N10 until M71 and M5 carry half the current of the variable devices M5A and M6A under the conditions of zero differential input voltage.

This feedback loop for amplifier A3 causes static devices M5 and M6 to carry half the current of variable devices M5A and M6A even under process, temperature and supply variations. The result is that the input devices M1 and M2 always carry current and a stable zero current state is avoided. It also makes certain that even a large differential input voltage can not cause one of the input loops to be reduced to zero current since it limits the control of the variable devices. This technique is similar to what is done when the tail current of the source-coupled pair is varied by a common-mode feedback loop to control the common-mode voltage. Only part of the tail current is controlled by the loop while a second tail current device provides a fractional constant current.

Returning to FIG. 19, during the offset voltage calibration for the VGA in calibration, switches short the inputs of the VGA. The VGA differential output currents drive the current mirror 320 across which is connected the successive approximation register (SAR) offset comparator 210. The state machine cycles through each bit of the digital to analog converter 230. The DAC 230 output is a differential current steered into the VGA input across resistor R1 to compensate for offset. Each bit of the DAC is tested in turn by the comparator 210 to determine if this bit should be latched on or off. In this way, the offset is trimmed to within a least significant bit of zero.

FIGS. 26 and 27 show two thermistor interface circuits that can be used to implement the thermal compensation technique shown in FIG. 20.

Returning to FIG. 20, the output of the thermistor interface circuit is a signal I-TEMP that flows through a resistor RPOLY connected across a VGA input creating a temperature dependent input voltage. The differential output current of the VGA is provided across a current mirror 250 which converts the output to a single ended current. The single ended output current is bucked against a constant reference current labeled IREF in FIG. 20.

The high impedance summing node of the mirror 250 drives one side of a source-coupled pair 260. The drain current of this device is the gain control current IGAIN. The other device in the pair is connected to a fixed bias voltage BIAS. This limits the gain control current to the tail current ITAIL of the pair. This prevents a saturation condition during start up. Even with the full tail current ITAIL applied as the gain signal, the VGA operates within its linear range.

In this manner, the output of the VGA is forced to remain constant in the presence of a temperature varying input signal. The feedback loop causes the gain to decrease with increasing input signal. The gain setting is then held on the track-hold capacitor C2 of FIG. 24 so the VGA can be placed into service.

Returning to FIGS. 26 and 27, the output of both of these circuits is a positive temperature coefficient voltage $VPTC=2\times IREF\times R3(1-RT/RTG)$ where RT is the resistance of the thermistor, RTG is the resistance of the external precision resistor, R3 is the resistance of an internal polyresistor shown in these figures and IREF is the internal reference current as shown. The version in FIG. 27 allows large capacitors C0 and C1 respectively, to be placed across both the thermistor and the precision external resistor for noise immunity while still maintaining stability. The voltage VPTC is developed across resistor R3. The signal TEMP provides a thermal monitoring signal to a monitoring device. A bandgap reference divided by an internal (to the IC) resistor produces a reference current. The current in turn is passed through the external precision resistor RTG to develop a voltage that is applied across the thermistor NTC RT. The internal resistor variations with process and temperature are canceled out.

FIG. 28 shows the system gain calculations. FIG. 28 shows one VGA in calibration and the second VGA in service and slaved to the first VGA. In the actual system, a VGA is first calibrated and subsequently moved into service with the gain setting stored on the hold capacitor C2. The dependencies in the system are the same as for this model however. The result for the gain is AV=[(¾)×RTZA]/[R3×(1−RNTC/REXT)]. For matched devices, the gain depends only on the resistor ratios and the value of the thermistor. RNTC=RT and REXT=RT6.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. A current sense amplifier for a voltage converter wherein the voltage converter has at least one channel providing an output current through an output inductor, the current sense amplifier monitoring the current in the at least one channel through the output inductor, the current sense amplifier comprising:
    a plurality of variable gain amplifiers, there being at least one more variable gain amplifier than channels in the voltage converter, whereby at least one variable gain amplifier is in a calibration mode for a preset period of time during which the variable gain amplifier is compensated for an offset error and the gain of the variable gain amplifier is calibrated to compensate for temperature of the output inductor, while during said preset period of time any remaining variable gain amplifiers are connected to monitor the channel current in each output inductor.

2. The current sense amplifier of claim 1, wherein the voltage converter comprises a multiphase converter having a plurality of channels each contributing to a total output current, and each channel having an output inductor, the current sense amplifier monitoring the current in each channel through each respective inductor.

3. The current sense amplifier of claim 2, further comprising
    an input multiplexer having a plurality of inputs coupled to monitoring circuits monitoring the currents in each of said output inductors and at least one additional input comprising a calibration input for the variable gain amplifier being calibrated,
    the input multiplexer having outputs coupled to inputs of each of the variable gain amplifiers;
    an output multiplexer having inputs coupled to the outputs of the variable gain amplifiers and outputs coupled to provide control functions for the multiphase converter and at least one calibration function for the variable gain amplifiers; and
    a controller for operating the input and output multiplexers to connect the input multiplexer inputs to the variable gain amplifiers and to connect the outputs of the variable gain amplifiers to the output multiplexer outputs in a preset sequence so that each of the variable gain amplifiers are calibrated at preset intervals.

4. The current sense amplifier of claim 3, further wherein the least recently calibrated variable gain amplifier is always the next variable gain amplifier to be calibrated.

5. The current sense amplifier of claim 3, wherein the gain of each variable gain amplifier is adjusted during calibration so that an output of the variable gain amplifier is maintained constant despite temperature variations of said output inductors.

6. The current sense amplifier of claim 5, further comprising a thermal monitoring circuit for monitoring the temperature of at least one of said output inductors, said thermal monitoring circuit providing a signal related to the inductor temperature.

7. The current sense amplifier of claim 6, further comprising a gain adjusting circuit for adjusting the gain of said variable gain amplifier in response to change in the temperature of said output inductor, said gain adjusting circuit comprising a switching circuit for switching an input of said variable gain amplifier at a preset time to receive an input of said thermal monitoring circuit and a feedback circuit connected to said variable gain amplifier to change the gain of said variable gain amplifier to maintain an output of said variable gain amplifier constant in response to said input of said thermal monitoring circuit.

8. The current sense amplifier of claim 3, further wherein said calibration function comprises an offset adjustment of said variable gain amplifier.

9. The current sense amplifier of claim 8, wherein said variable gain amplifier comprises an amplifier providing a differential output signal, and wherein, to compensate for an offset error of said differential output signal, an offset determining circuit is provided to trim the variable gain amplifier to compensate for the offset error.

10. The current sense amplifier of claim 9, wherein the offset determining circuit comprises a comparator circuit coupled to an output of the output multiplexer comprising the calibration function, and
    further wherein said variable gain amplifier has a differential input pair, and further comprising a circuit for shorting said differential input pair at a preset time during which said variable gain amplifier is in the calibration mode, and whereby said comparator circuit is provided with an output of said variable gain amplifier when the differential input pair of said variable gain amplifier is shorted for determining the amount of offset error present in said variable gain amplifier; and further comprising a feedback circuit coupling an output of said comparator to a trimming input of said variable gain amplifier to trim said variable gain amplifier for said offset error.

11. The current sense amplifier of claim 10, wherein said feedback circuit comprises a digital successive approximation register and a digital to analog converter providing an analog output to trim the variable gain amplifier for the offset error.

12. The current sense amplifier of claim 2, wherein the current sense amplifier comprises a plurality of inductor current sense circuits, one for each output inductor, and wherein each current sense circuit comprises an RC filter disposed across the output inductor such that the current monitored is proportional to the voltage across an inherent DC resistance of the output inductor.

13. The current sense amplifier of claim 6, wherein the thermal monitoring circuit include a thermistor and a resistor reference.

14. The current sense amplifier of claim 3, wherein the output mulitplexer couples the variable gain amplifiers to the multiphase converter circuit so as to control the voltage positioning of an output voltage of the converter with respect to output current; current balance between channels of the multiphase converter; and an overcurrent limit for the multiphase converter.

15. The current sense amplifier of claim 3, further comprising a plurality of current splitters coupling the outputs of the variable gain amplifiers to said inputs of said output multiplexer.

16. The current sense amplifier of claim 3, wherein each variable gain amplifier comprises a differential input amplifier transistor pair wherein a first current proportional to a voltage difference between inputs to the input transistor pair is developed across a resistor coupling the input transistor pair and further comprising:

respective further transistors each coupled in series with the transistors of the input pair and wherein current equal to the sum and difference of a reference current and said first current is developed in respective ones of the further transistors coupled in series with the input transistor pair;

further comprising a gain stage for developing currents equal to a gain factor multiplied by said sum and difference currents and for developing an output current proportional to said gain factor multiplied by said first current; and further comprising a gain adjustment stage for adjusting the gain factor based on an external input.

17. The current sense amplifier of claim 16, further comprising an offset calibration circuit having an output, and wherein the output of said offset calibration circuit is provided across said resistor to adjust the current flowing in said resistor to compensate for an offset error of said variable gain amplifier.

18. The current sense amplifier of claim 16, wherein the external input is a temperature dependent signal.

* * * * *